(12) United States Patent
Tanuma et al.

(10) Patent No.: US 8,389,339 B2
(45) Date of Patent: Mar. 5, 2013

(54) METHOD OF MANUFACTURING SEMICONDUCTOR DEVICE

(75) Inventors: Yusuke Tanuma, Kanagawa (JP); Toshikazu Ishikawa, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/235,247

(22) Filed: Sep. 16, 2011

(65) Prior Publication Data

US 2012/0083073 A1 Apr. 5, 2012

(30) Foreign Application Priority Data

Sep. 30, 2010 (JP) ................................. 2010-222438

(51) Int. Cl.
*H01L 21/58* (2006.01)
(52) U.S. Cl. .................... 438/125; 438/107; 438/108
(58) Field of Classification Search .................. 438/125, 438/106, 107, 108, 129; 257/686, 691, 692, 257/784, E23.07, E23.178, E21.505
See application file for complete search history.

(56) References Cited

U.S. PATENT DOCUMENTS

| | | | | |
|---|---|---|---|---|
| 7,361,997 | B2* | 4/2008 | Yashiro | 257/786 |
| 2004/0164385 | A1* | 8/2004 | Kado et al. | 257/678 |
| 2005/0082682 | A1* | 4/2005 | Liu | 257/778 |
| 2009/0065773 | A1* | 3/2009 | Ishikawa et al. | 257/48 |
| 2009/0294945 | A1* | 12/2009 | Okada et al. | 257/686 |
| 2010/0019382 | A1* | 1/2010 | Miwa et al. | 257/737 |
| 2011/0124159 | A1* | 5/2011 | Tanoue | 438/123 |
| 2012/0038040 | A1* | 2/2012 | Jang et al. | 257/737 |

FOREIGN PATENT DOCUMENTS

JP 2007-335581 A 12/2007

* cited by examiner

*Primary Examiner* — Kimberly Rizkallah
*Assistant Examiner* — Mounir Amer
(74) *Attorney, Agent, or Firm* — Miles and Stockbridge P.C.

(57) ABSTRACT

It is aimed at improving the reliability of a semiconductor device.
In a POP having an upper package stacked on a lower package, an opening of a first solder resist film in a first region between a first group of lands arranged at the periphery of an front surface of a wiring substrate of the lower package and a second group of lands arranged in a central part is filled with a second solder resist film, and thereby the formation of a starting point of cracks in the opening becomes unlikely to suppress occurrence of cracks and improve the reliability of the POP.

8 Claims, 33 Drawing Sheets

METHOD OF MANUFACTURING SEMICONDUCTOR DEVICE

CROSS-REFERENCE TO RELATED APPLICATION

The disclosure of Japanese Patent Application No. 2010-222438 filed on Sep. 30, 2010 including the specification, drawings and abstract is incorporated herein by reference in its entirety.

BACKGROUND

The present invention relates to technology for manufacturing a semiconductor device, and particularly to technology which can be effectively applied to assembling a semiconductor device which is formed by stacking another substrate on a main surface of a substrate having semiconductor chips mounted thereon.

Recently, there has been increasing demand for larger number of pins on semiconductor devices having semiconductor chips mounted thereon. As a semiconductor device meeting such demand, a BGA (Ball Grid Array) is considered effective, having semiconductor chips mounted on the front surface of a wiring substrate, as well as a plurality of solder balls provided at the rear surface side of the wiring substrate to act as external terminals.

Japanese Patent Laid-Open No. 2007-335581 (Patent Document 1), for example, describes the structure of such a semiconductor device. In addition, a plating layer needs to be formed on the surface of each electrode of the wiring substrate used in the semiconductor device, for which the Patent Document 1, discloses a technique of providing a power supply line for electrolytic plating to form a plating layer on each electrode via the power supply line.

In order to increase the number of pins (for higher functionality) of and to downsize a so-called BGA-type semiconductor device using a wiring substrate, it is desirable to arrange a plurality of electrodes (bonding leads and lands) of the wiring substrate not only on the periphery but also on the central part of the wiring substrate as described in Patent Document 1, for example.

Considering the reliability of the semiconductor device, it is desirable to form a plating layer on the surface of each electrode of the wiring substrate by electrolytic plating as described in Patent Document 1. The reason for this is to enhance the joining strength between each electrode (bonding pad) of the semiconductor chip mounted on the wiring substrate or a conductive member (wire and bump electrode) used when coupling to another electronic component (semiconductor device) mounted on the wiring substrate and an electrode of the wiring substrate.

Although electroless plating may be used to simply form a plating layer, it is desirable to use electrolytic plating since electroless plating requires a longer time to form the plating layer (deposition time of a plating film) than electrolytic plating.

If, on the other hand, by electrolytic plating, it is necessary to draw a wiring (power supply line) from each electrode to the periphery of the wiring substrate to supply electric power to each electrode pad of the wiring substrate, as described in Patent Document 1.

However, it has became difficult in terms of space to individually couple the wiring (power supply line) to each electrode mounted on the central part of the wiring substrate as semiconductor devices are downsized and provided with increased number of pins (for higher functionality).

It is thus effective, as described in Patent Document 1, to reduce the number of wirings (power supply lines) drawn as far as the end portion of the wiring substrate by sharing (using in common) the wirings (power supply lines) coupled to each of the electrodes mounted on the central part of the wiring substrate in a region (inside the electrodes mounted on the central part of the wiring substrate, according to Patent Document 1).

In the semiconductor device examined by the inventors of the present application, however, the number of electrodes formed on the wiring substrate has been further increasing, whereby it has become difficult to share (use in common) all the wirings (power supply lines) coupled to each of the electrodes mounted on the central part of the wiring substrate in the central part (inside the electrodes mounted on the central part side of the wiring substrate). This is because the region in the central part of the wiring substrate (region inside the electrodes mounted on the central part side of the wiring substrate) is narrower (smaller) than the region at the periphery of the wiring substrate (region outside the electrodes mounted on the central part side of the wiring substrate).

The inventors therefore examined sharing (using in common), between the electrodes mounted on the central part side of the wiring substrate and the electrodes mounted on the periphery side of the wiring substrate in the plan view, the wirings (power supply lines) coupled to each of the electrodes mounted on the central part side of the wiring substrate, and encountered the following problems.

Since a common signal (including power source electric potential and reference potential) does not flow in each of the electrodes on the wiring substrate, each of the electrodes on the wiring substrate must be electrically separated from each other after a plating layer has been formed on the surface thereof.

However a crack occurred on the wiring substrate starting from a groove formed on the front surface of the wiring substrate due to the above separation step.

When a crack occurs on the wiring substrate, the crack proceeds along the wiring formed on the wiring substrate, which may lead to a problem of broken wiring and thus it is necessary to take preventive measures against such a crack.

An additional examination of the inventors has revealed that, in the case of Patent Document 1, a shared part of the wiring (power supply line) to be removed by the separation step is provided beneath the semiconductor chip (a part covered by the semiconductor chip) and a groove formed by the separation step is filled with a die-bonding material (adhesive agent) for mounting the semiconductor chip, and thus the crack is less likely to start from the groove.

The present invention has been made in view of the above circumstances and provides technology which can improve the reliability of a semiconductor device.

It is another object of the invention to provide technology which can increase the number of pins on a semiconductor device.

It is also another object of the invention to provide technology which can downsize a semiconductor device.

The above and other purposes and the new feature of the present invention will become clear from the description of the present specification and the accompanying drawings.

SUMMARY

The following explains briefly the outline of a typical invention among the inventions disclosed in the present application.

In a method of, manufacturing a semiconductor device according to a representative embodiment, a wiring substrate provision step provides a wiring substrate including a first front surface-side insulating film, which has an opening to open a first region, formed on the front surface, such that a first electrode terminal group and a second electrode terminal group are exposed, and a plurality of first power supply lines and second power supply lines are covered; and a second front surface-side insulating film formed over the first front surface-side insulating film, such that the inside of the opening is filled, and the first electrode terminal group and the second electrode terminal group are exposed. In addition, a plating layer is formed on the surface of the first electrode terminal group and the second electrode terminal group by electrolytic plating, and also the first region is provided along the side of the semiconductor chip in the plan view, the first region is provided around the semiconductor chip in the plan view, and the second front surface-side insulating film is circularly formed in the plan view around the semiconductor chip.

The following explains briefly the effect acquired by the typical invention among the inventions disclosed in the present application.

The reliability of the semiconductor device can be improved.

DETAILED DESCRIPTION

Figure 1:
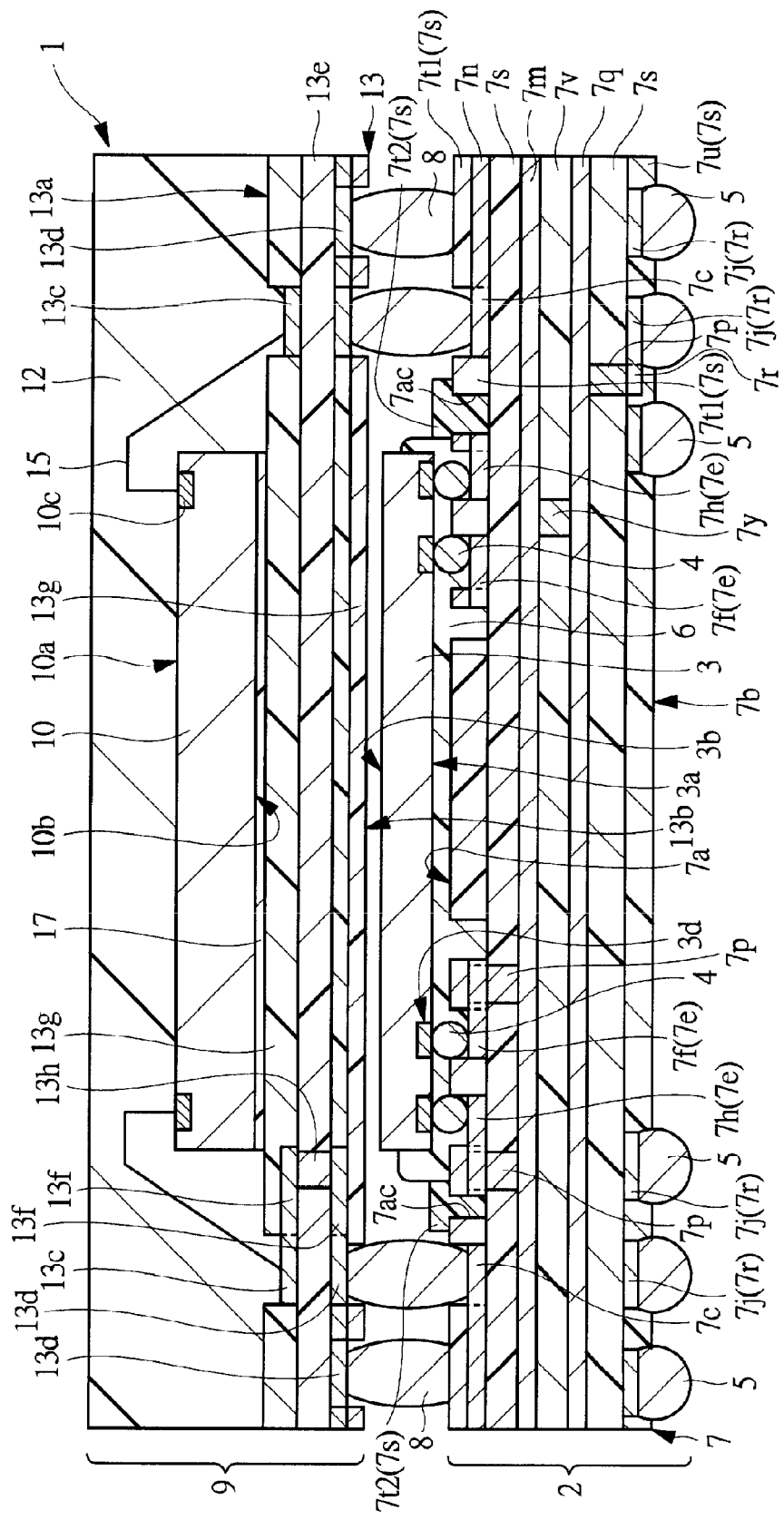
FIG. 1 is a cross-sectional view illustrating an exemplary structure of a semiconductor device according to an embodiment of the present invention.

In the following embodiments, description of identical or similar parts is not repeated in principle unless otherwise required.

Furthermore, although the following embodiments may be described in a manner divided into a plurality of sections or embodiments as required for convenience, they are not mutually unrelated unless otherwise explicitly stated, and one may be a variation, detail or supplementary description of a part or the whole of another.

Additionally, in referring to the number of elements (including the number of items, the numerical value, the amount, the range, or the like) in the following embodiments, the specific number is not limiting and any number exceeding or below the specific number may be used, unless otherwise explicitly stated or apparently limited to the specific number in principle.

Additionally, it is needless to say in the following embodiments that a component (including the element steps or the like) is not indispensable unless otherwise explicitly stated or apparently required in principle.

Additionally, it is needless to say in the following embodiments that the expressions "comprising A", "comprised of A", "having A", or "including A" with regard to a component do not exclude other components unless otherwise explicitly stated that only the particular component exists. Similarly, it is assumed in the following embodiments that, in referring to the shape of a component or the positional relation, those having substantially approximate or similar shapes are also included unless otherwise explicitly stated or apparently denied in principle. The same goes for the numerical value and the range stated above.

Embodiments of the present invention will be described in detail below, referring to the drawings. In all the drawings describing the embodiments, the same reference numerals are provided to the members having the same functionality and the duplicated description thereof is omitted.

Embodiment

FIG. 1 is a cross-sectional view illustrating an exemplary structure of a semiconductor device according to an embodiment of the present invention.

First, the semiconductor device of the embodiment will be described.

The semiconductor device is formed by stacking another wiring substrate having another semiconductor chips mounted thereon on a wiring substrate having semiconductor chips mounted thereon. Here, a POP (Package On Package) semiconductor device (simply referred to as a POP hereafter) having a plurality of semiconductor packages stacked therein is described as an example of the semiconductor device.

A POP comprises, for example, a wiring substrate (base material) having a memory-type semiconductor chip mounted thereon, and another wiring substrate (base material) having a controller-type semiconductor chip mounted thereon which has a built-in control circuit for controlling the memory-type semiconductor chip. The structure of the POP is completed by stacking the wiring substrates and coupling the upper wiring substrate and the lower wiring substrate via a conductive member. Accordingly, the semiconductor chips mounted on each wiring substrate are coupled to construct a system. Furthermore, the POP is mounted on a mother substrate (mounting substrate) having external electronic devices mounted thereon, via an external terminal provided on the rear surface of the rear wiring substrate, for example.

A POP 1, which is the semiconductor device of the embodiment shown in FIG. 1, is a two-stage, stacked semiconductor package formed by stacking an upper package 9 having mounted thereon a memory chip 10, which is a memory-type semiconductor chip, on a lower package 2 having mounted thereon a controller chip 3, which is a controller-type semiconductor chip. A wiring substrate (lower substrate) 7 of the lower package 2 and a wiring substrate (upper substrate) 13 of the upper package 9 are coupled by a conductive member for coupling the upper and lower stages, and a plurality of solder balls 5 is provided on a rear surface 7b of the lower substrate 7 to serve as an external terminal of the POP 1. The conductive member for coupling the upper and lower stages in the embodiment is a solder ball 8, for example.

With the POP 1, therefore, the memory chip 10 on the upper stage is controlled by the controller chip 3 on the lower stage via the solder ball 8, and the controller chip 3 transmits and receives electrical signals to and from external electronic devices via the solder balls 5.

With the POP 1, the controller chip 3 on the lower package 2 is coupled to the lower substrate 7 (flip-chip coupling) as a conductive member via a bump electrode 4, while the memory chip 10 on the upper package 9 is coupled to the upper substrate 13 (wire coupling) as a conductive member via a wire 15. The bump electrode 4 in the present embodiment is made of solder (including lead-free solder), for example.

Next, the lower package 2 in the POP 1 will be described in detail.

Figure 2:
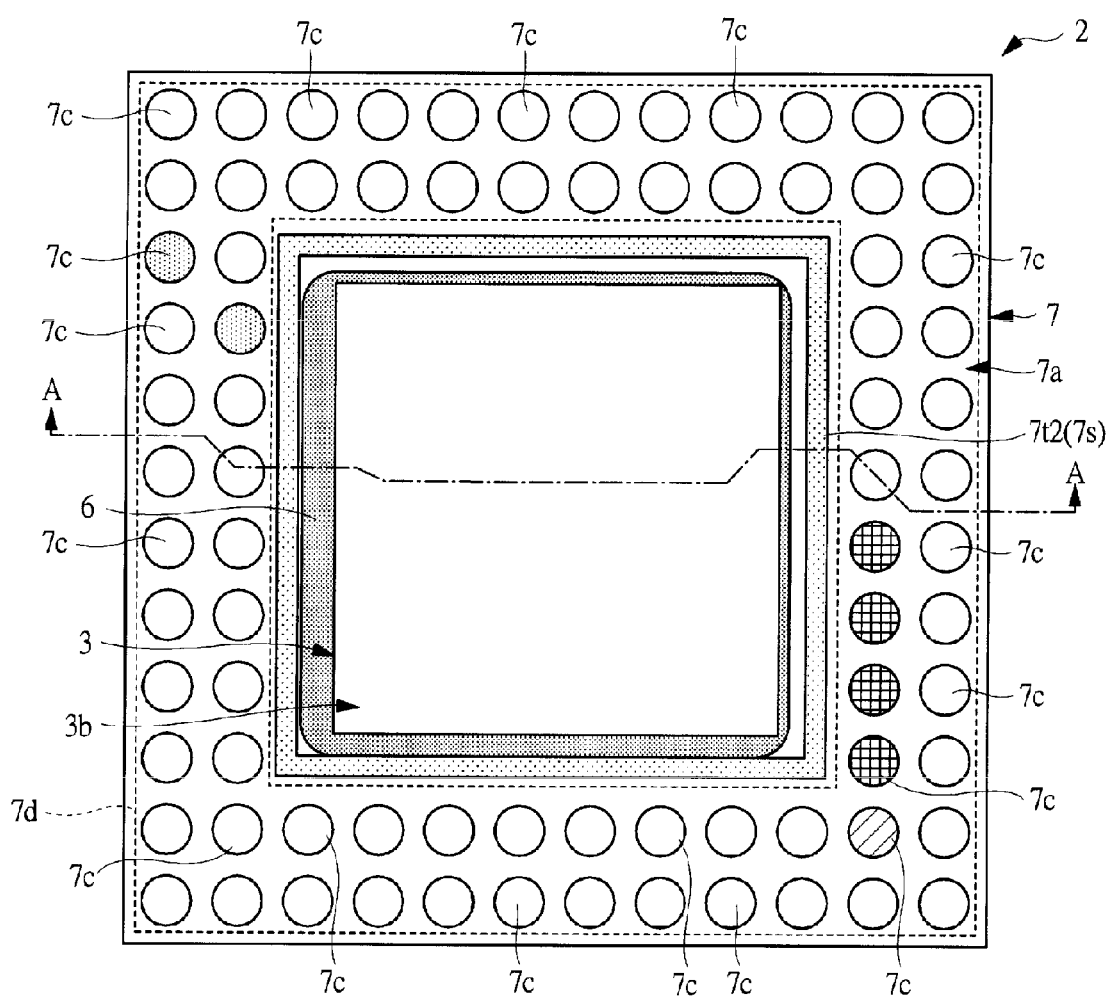
FIG. 2 is a plan view illustrating an exemplary structure of a lower package of the semiconductor device of FIG. 1.
Figure 3:
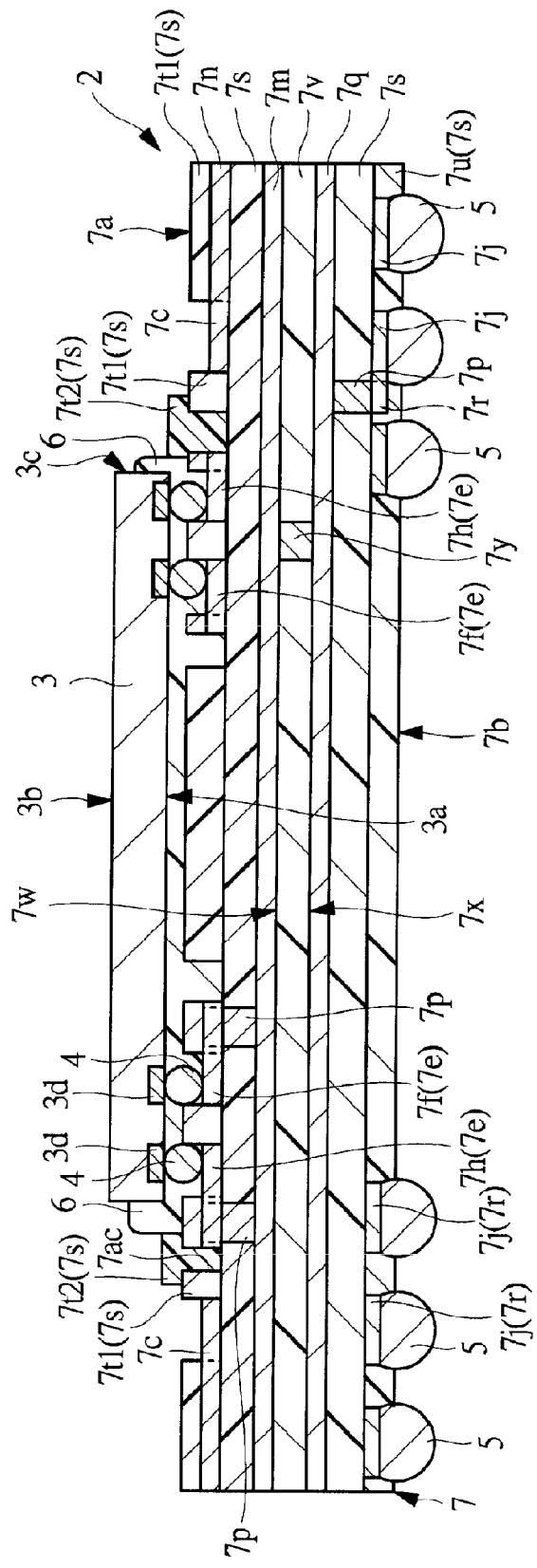
FIG. 3 is a cross-sectional view illustrating an exemplary structure taken along the line A-A of FIG. 2.
Figure 4:
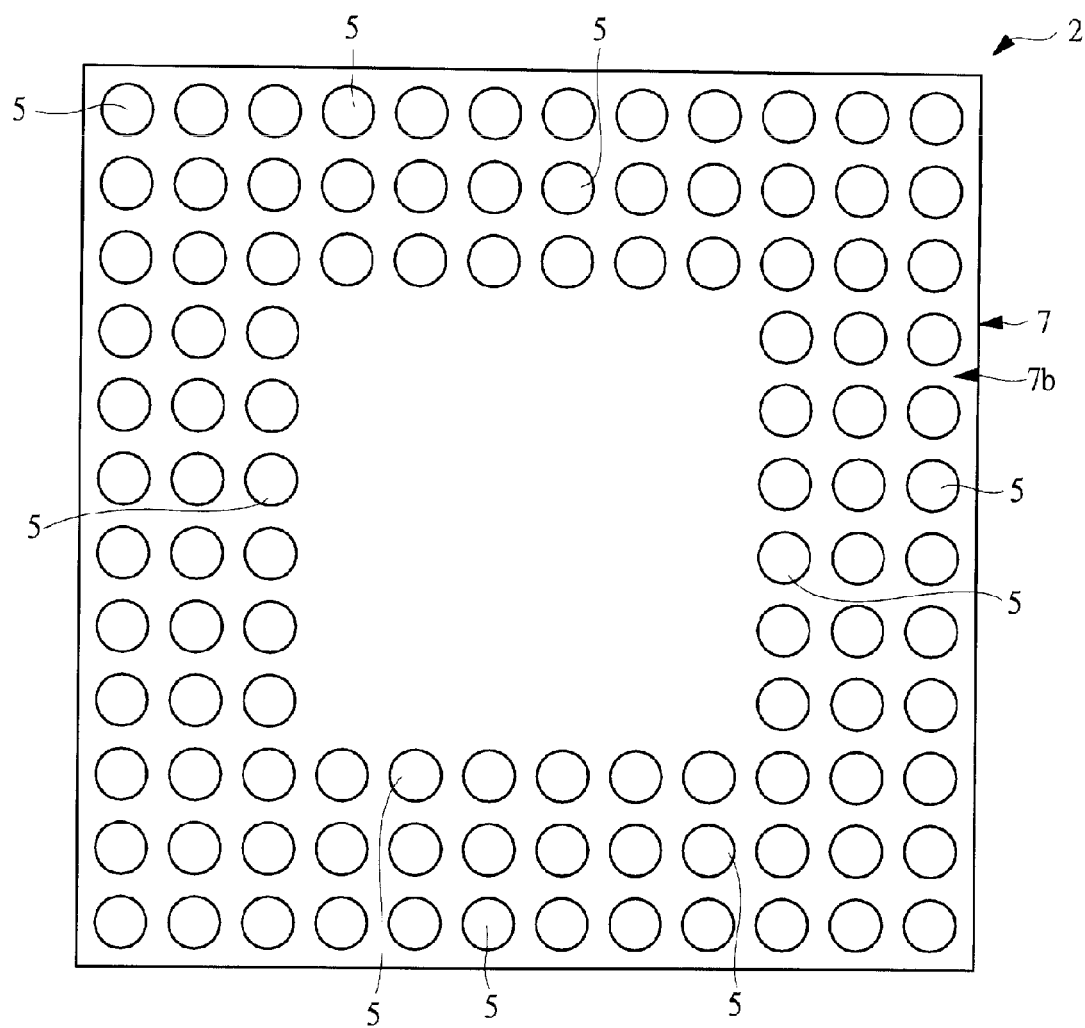
FIG. 4 is a rear view illustrating an exemplary structure of a rear surface side of the lower package of FIG. 2.

FIG. 2 is a plan view illustrating an exemplary structure of a lower package of the semiconductor device of FIG. 1, FIG. 3 is a cross-sectional view illustrating an exemplary structure taken along the line A-A of FIG. 2, and FIG. 4 is a rear view illustrating an exemplary structure of a rear surface of the lower package of FIG. 2.

First, the structure of the lower package 2 includes the lower substrate 7 which is a wiring substrate having multiple wiring layers formed thereon as shown in FIGS. 2 and 3, the controller chip 3 mounted on an front surface 7a of the lower substrate 7 by flip-chip coupling, a plurality of bump electrodes 4 which couples the lower substrate 7 and the controller chip 3, an underfill material 6 which is filled in a gap between the controller chip 3 and the lower substrate 7 and also applied to the circumference of the controller chip 3, and the solder balls 5 shown in FIG. 4 which are mounted on the rear surface 7b of the lower substrate 7.

That is, in the lower package 2, the controller chip 3 having the bump electrode 4 formed thereon is flip-chip mounted on the front surface 7a of the lower substrate 7 via the bump electrode 4, and the flip-chip coupling portion is protected by the underfill material (sealing material) 6 filled between the controller chip 3 and the lower substrate 7. In other words, the controller chip 3 is face-down mounted on the front surface 7a of the lower substrate 7.

Here, as shown in FIG. 2, the planar shape of the front surface 7a of the lower substrate 7 of the lower package 2 is a quadrangle, with a plurality of electrodes aligned in two columns on the periphery of the front surface 7a. These electrodes are pre-stack lands (first electrodes) 7c provided in a region outside the controller chip 3 of the lower substrate 7. The pre-stack land 7c is a lower substrate electrode to which the solder ball 8 coupling the lower package 2 and the upper package 9 is coupled, as shown in FIG. 1.

Additionally, as shown in FIG. 2, in a region further inside a first group of lands (first electrode terminal group) 7d which is a collection of pre-stack lands 7c corresponding to each side of the front surface 7a of the lower substrate 7, i.e., in the central part (chip-mounting region 7k shown in FIG. 7) of the front surface 7a in the plan view, a plurality of flip-chip lands (second electrodes) 7e which are flip-chip coupling electrodes is provided corresponding to the array of pads 3d of a main surface 3a of the controller chip 3 as shown in FIG. 3, and each pad 3d of the controller chip 3 and each flip-chip land 7e corresponding to each pad 3d are coupled via the bump electrode 4 which is a solder bump.

Therefore, the controller chip 3 is mounted on the central part of the front surface 7a in a face-down manner so that its main surface 3a faces the front surface 7a of the lower substrate 7.

In the POP 1, the flip-chip land 7e also has a two-column arrangement of flip-chip lands if on the inner column and flip-chip lands 7h on the outer column corresponding to the pad column of the controller chip 3, as shown in FIG. 3.

Additionally, as shown in FIG. 2, an insulating film (solder resist film 7t2) 7s is circularly formed in the plan view outside the region where the underfill material 6 of the front surface 7a of the lower substrate 7 is applied. Additionally, as shown in FIG. 3, the insulating film (solder resist film 7t2) 7s is formed to be convex upward (toward the upper substrate 13) from the insulating film (solder resist film 7t1) 7s formed on the front surface 7a of the lower substrate 7 such that the pre-stack land 7c and the flip-chip land 7e are exposed. The insulating film 7s (solder resist film 7t2) is a bleed preventing dam of the underfill material 6, and also has a function of filling an opening 7ac of the insulating film (solder resist film 7t1) 7s for removing a power supply line 7zc shown in FIG. 7 described below.

Therefore, in the plan view, the inner region of the circularly formed insulating film (solder resist film 7t2) 7s is the region where the underfill material 6 is applied. The peripheral edge of the underfill material 6 however must not extend beyond the insulating film (solder resist film 7t2) 7s, but may cover the insulating film (solder resist film 7t2) 7s.

In addition, the solder balls 5 to serve as external terminals of the POP 1 are arranged in three columns from an end portion (side) of the rear surface 7b on the rear surface 7b of the lower substrate 7, as shown in FIG. 4. The solder balls 5 are coupled to lands (ball lands) 7j of the rear surface 7b, respectively, and arranged in a grid pattern in a region corresponding to the periphery of the rear surface 7b except for the region of central part under the chip, as shown in FIG. 3. Although description is provided in the embodiment about forming the solder balls 5 in all the lands 7j, a part of the lands 7j may be used as test lands without forming the solder balls 5.

Although no plating layer is drawn for the flip-chip land 7e and the pre-stack land 7c of the lower substrate 7 in FIG. 3, a plating layer (plating film) such as gold (Au), for example, is formed on the surface of the flip-chip land 7e and the pre-stack land 7c, respectively.

Next, the structure of the lower substrate 7 and the method of manufacturing thereof will be described in detail.

Figure 5:
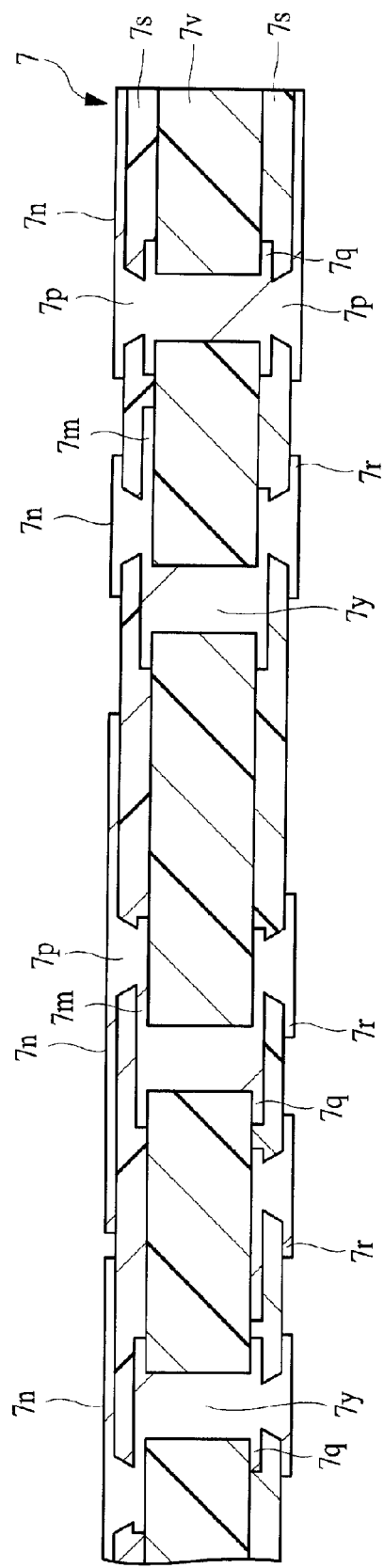
FIG. 5 is a partial cross-sectional view illustrating an exemplary structure of a wiring substrate used for assembling the lower package of FIG. 2.
Figure 6:
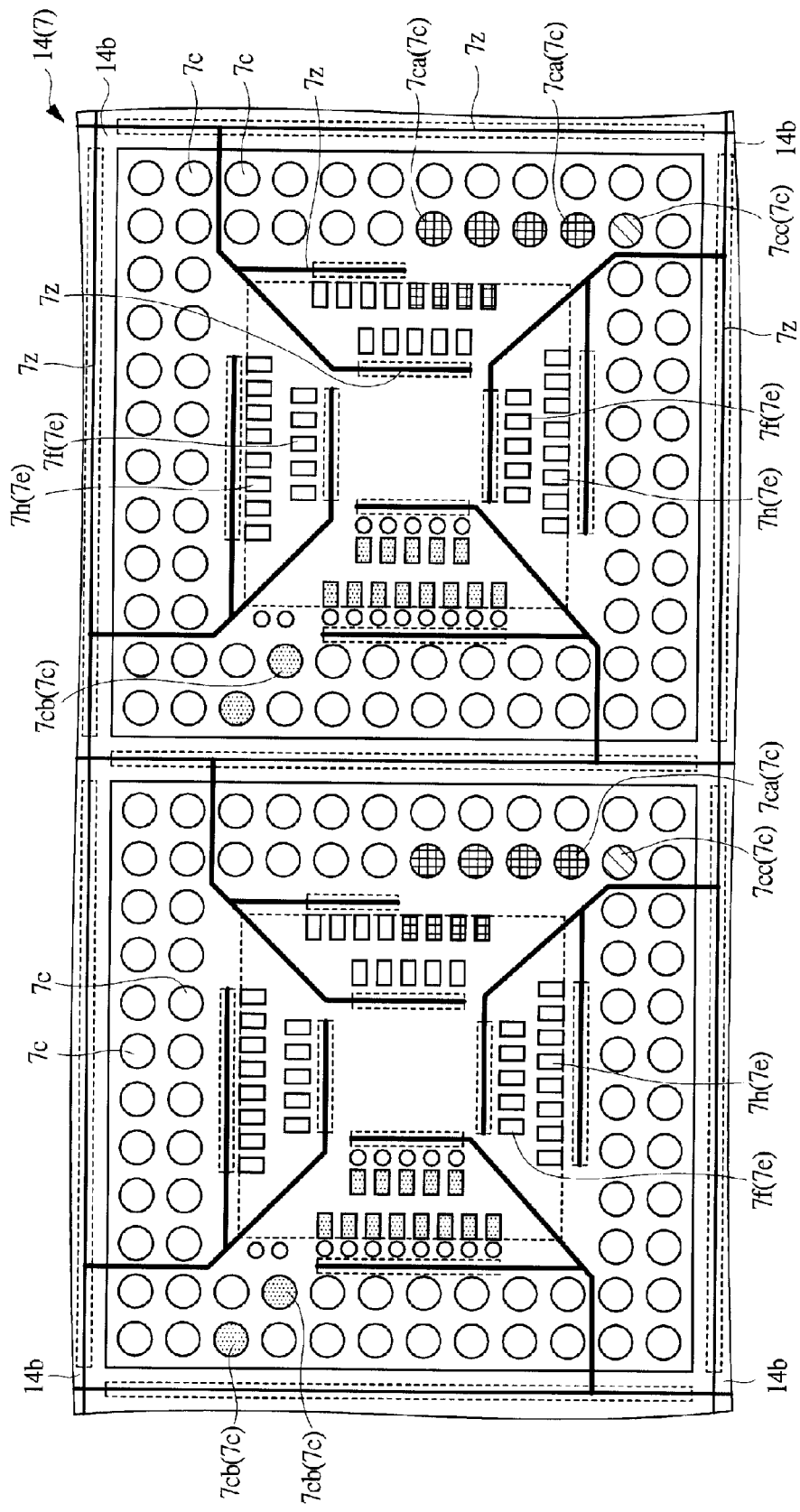
FIG. 6 is a partial plan view illustrating an exemplary structure of the wiring substrate used for assembling the lower package of FIG. 2.
Figure 7:
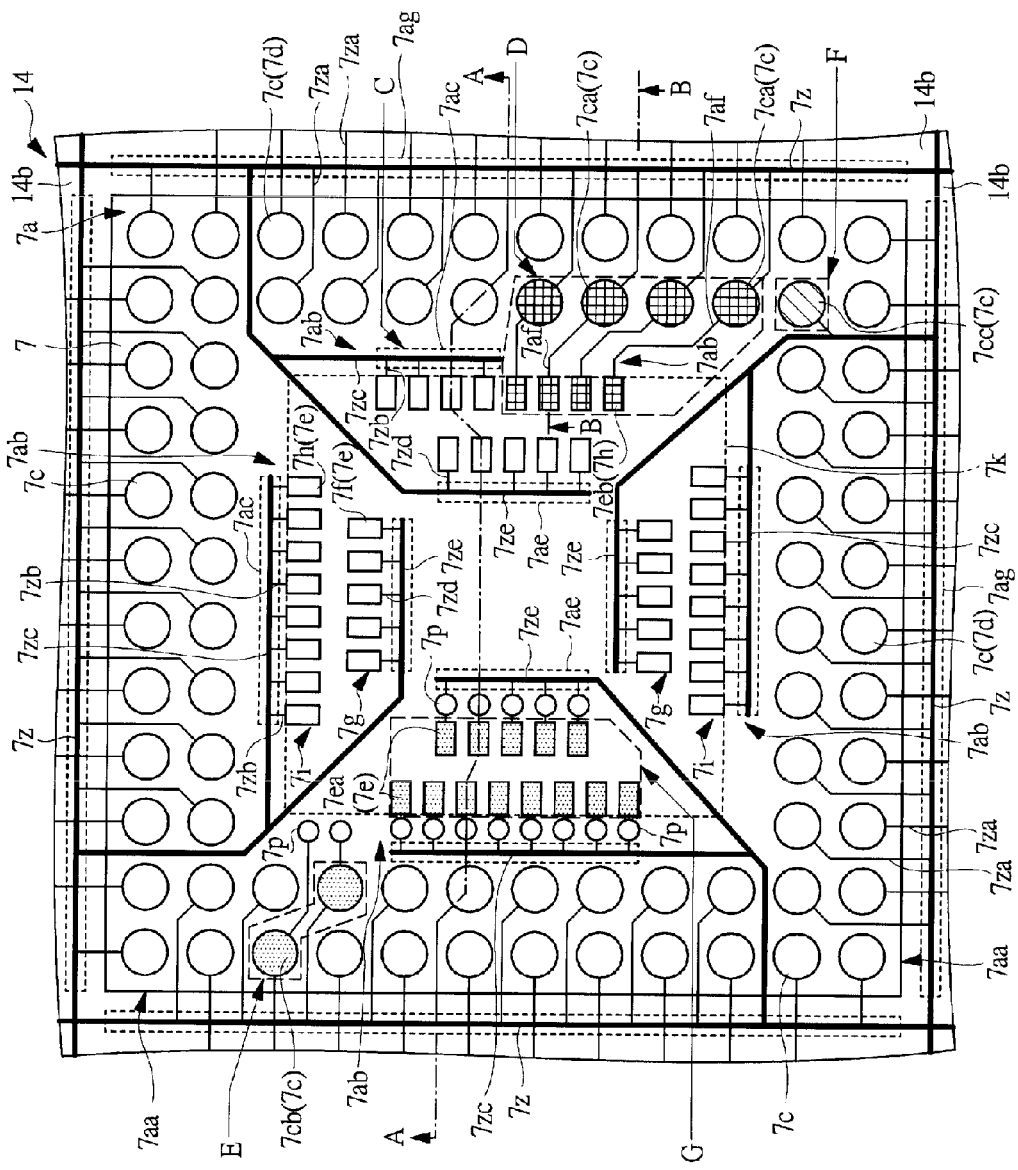
FIG. 7 is an enlarged partial plan view illustrating an exemplary structure of the wiring substrate shown in FIG. 6.
Figure 8:
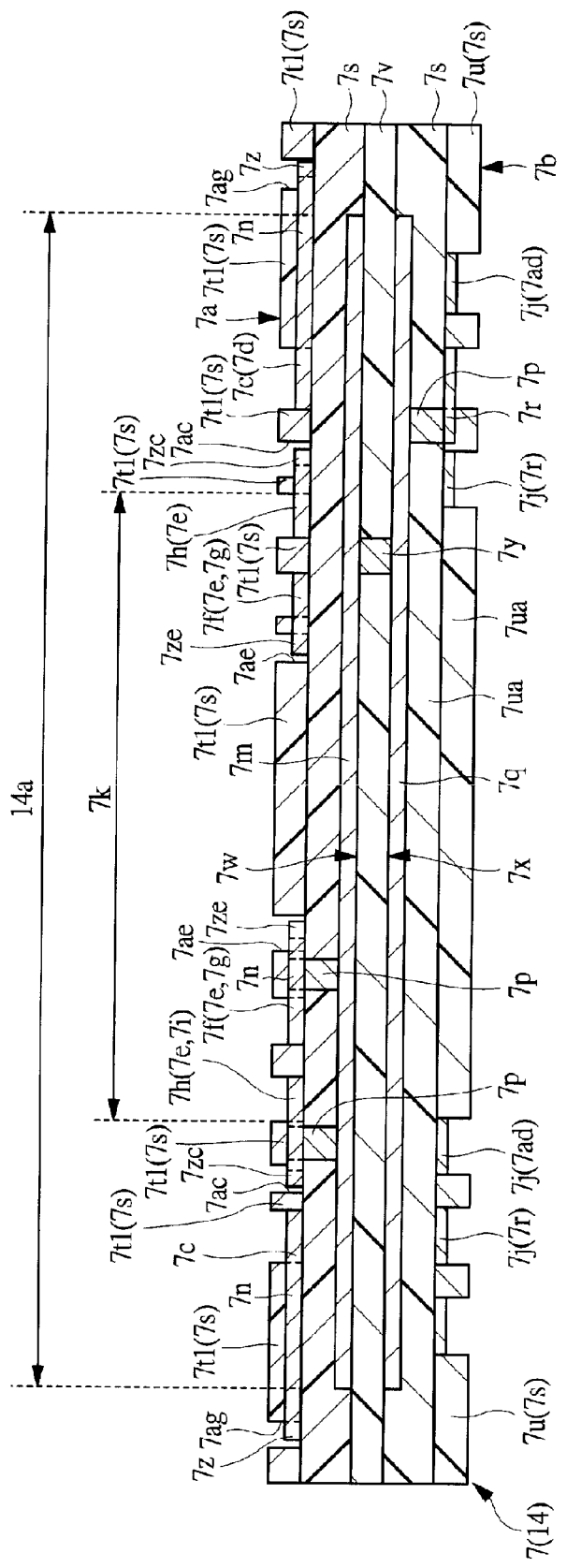
FIG. 8 is a cross-sectional view illustrating an exemplary structure taken along the line A-A of FIG. 7.
Figure 9:
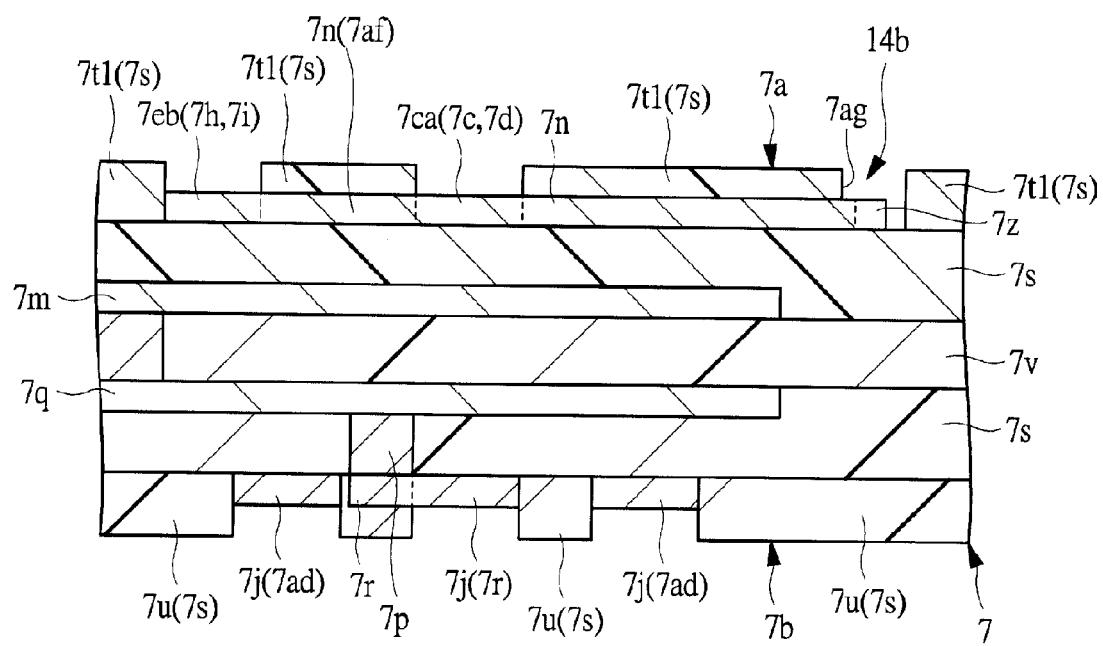
FIG. 9 is an enlarged partial cross-sectional view illustrating an exemplary structure taken along the line B-B of FIG. 7.
Figure 10:
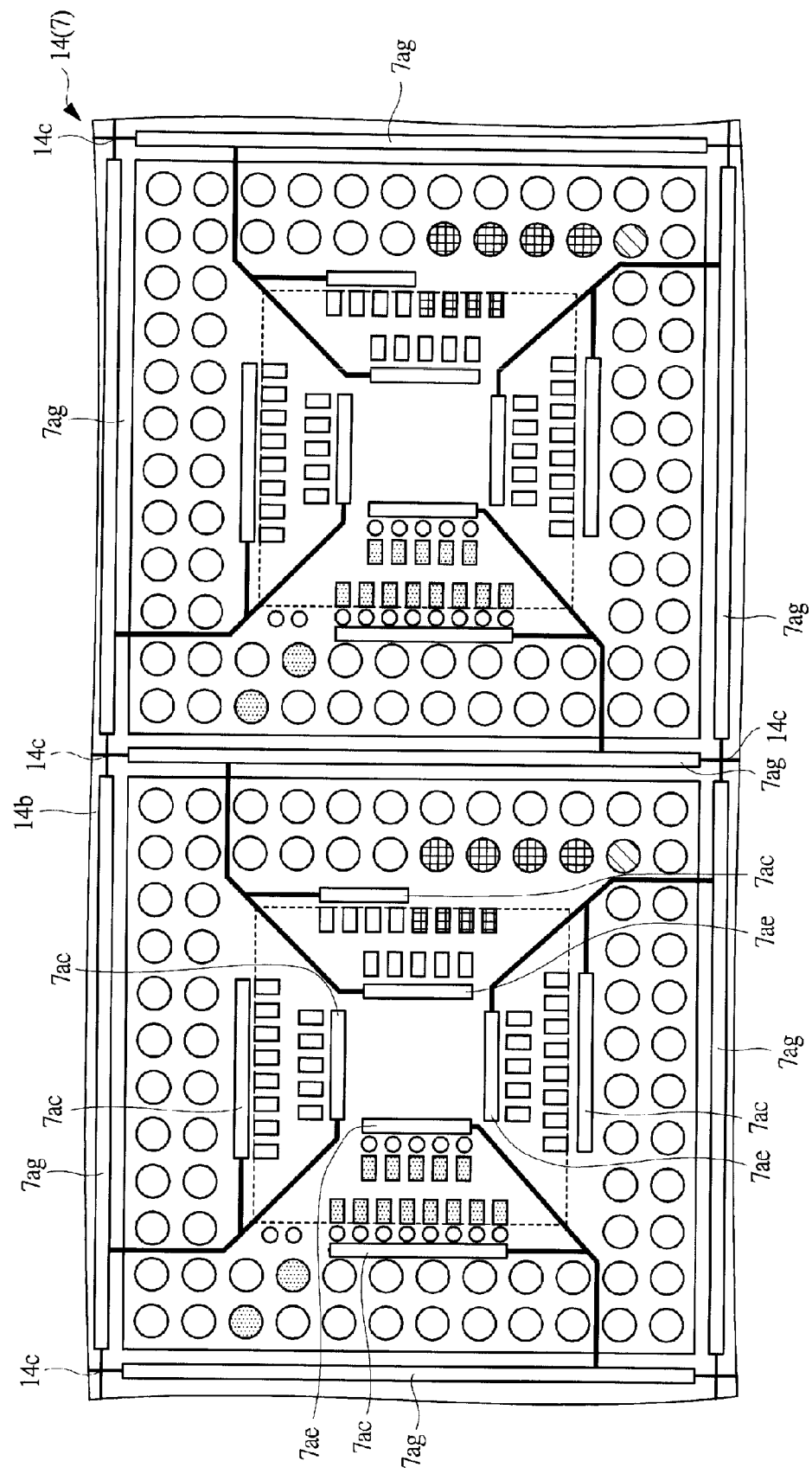
FIG. 10 is a partial plan view illustrating an exemplary structure after removal of a power supply line of the wiring substrate of FIG. 6.
Figure 11:
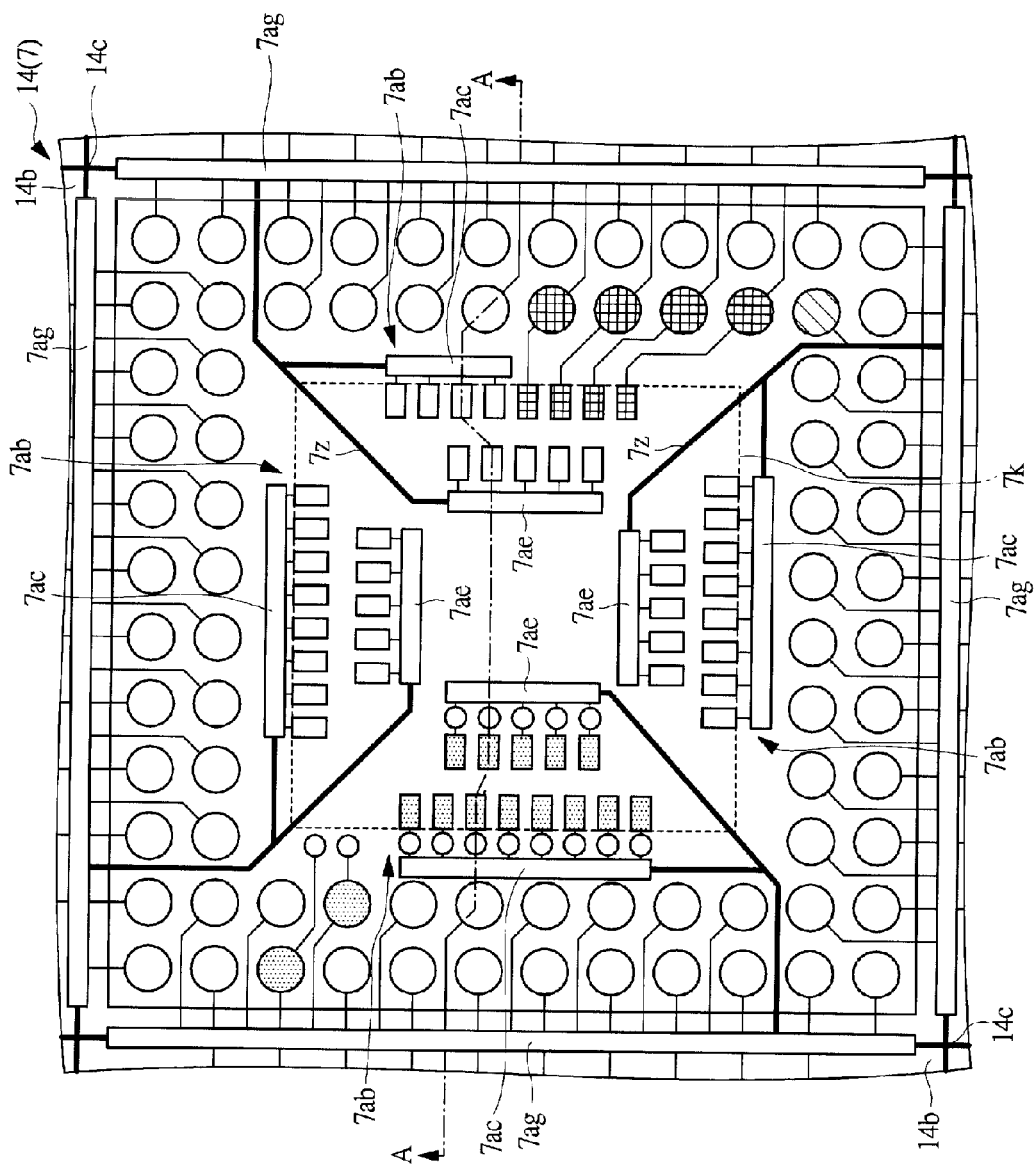
FIG. 11 is an enlarged partial plan view illustrating an exemplary structure of the wiring substrate shown in FIG. 10.
Figure 12:
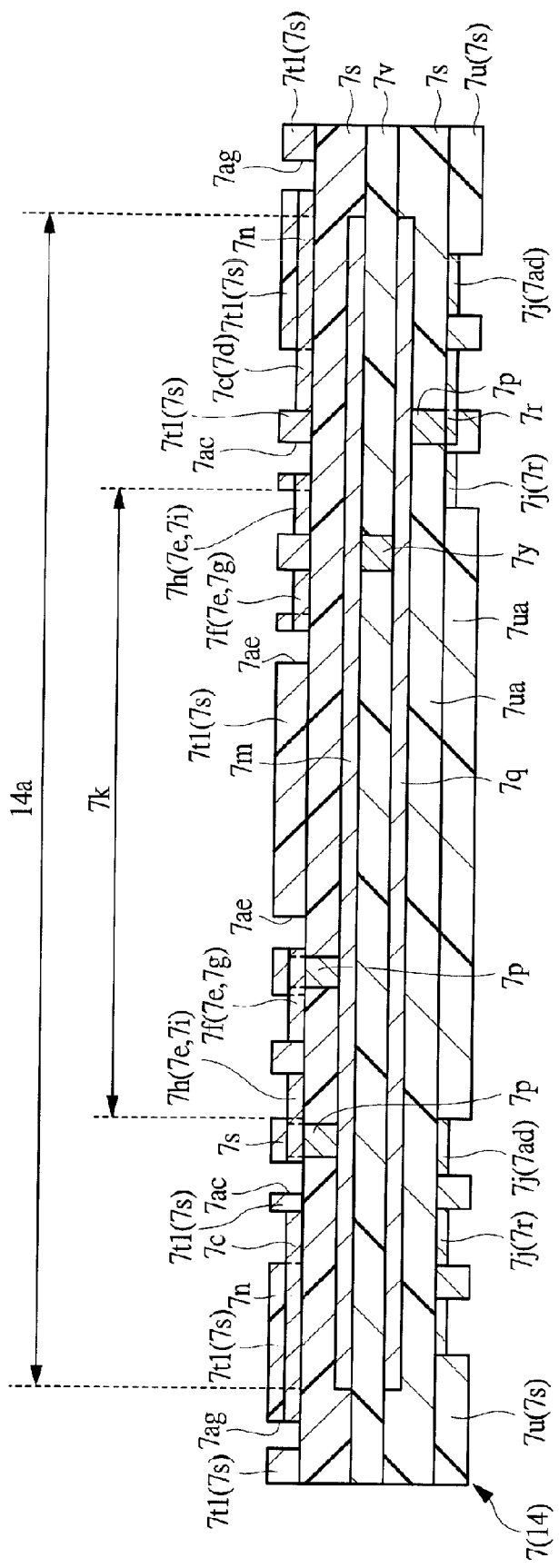
FIG. 12 is a cross-sectional view illustrating an exemplary structure taken along the line A-A of FIG. 11.
Figure 13:
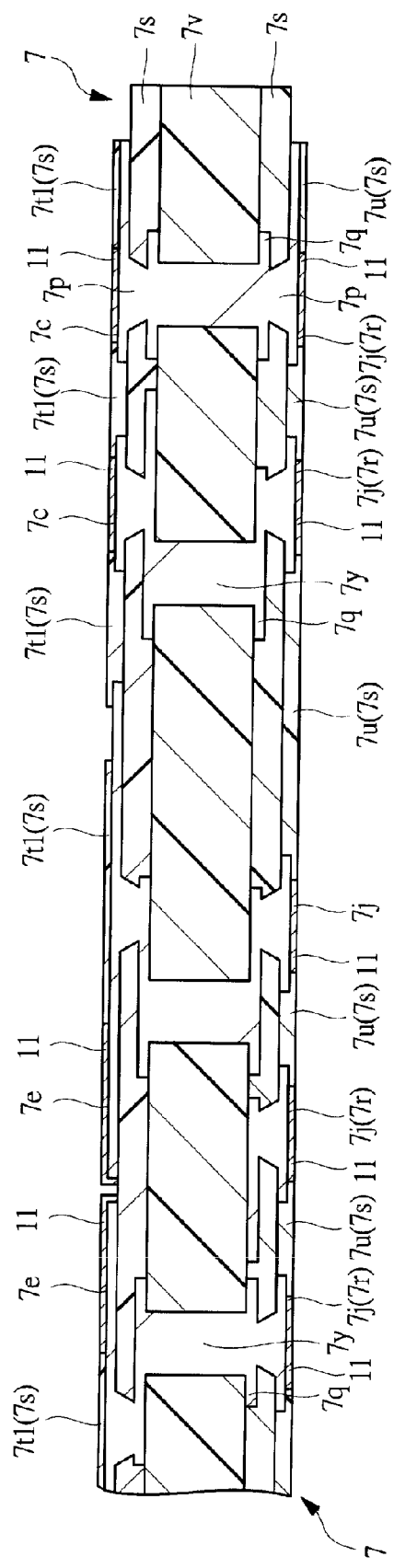
FIG. 13 is a partial cross-sectional view illustrating an exemplary structure after the formation of a first front surface-side insulating film of the wiring substrate used for assembling the lower package of FIG. 2.
Figure 14:
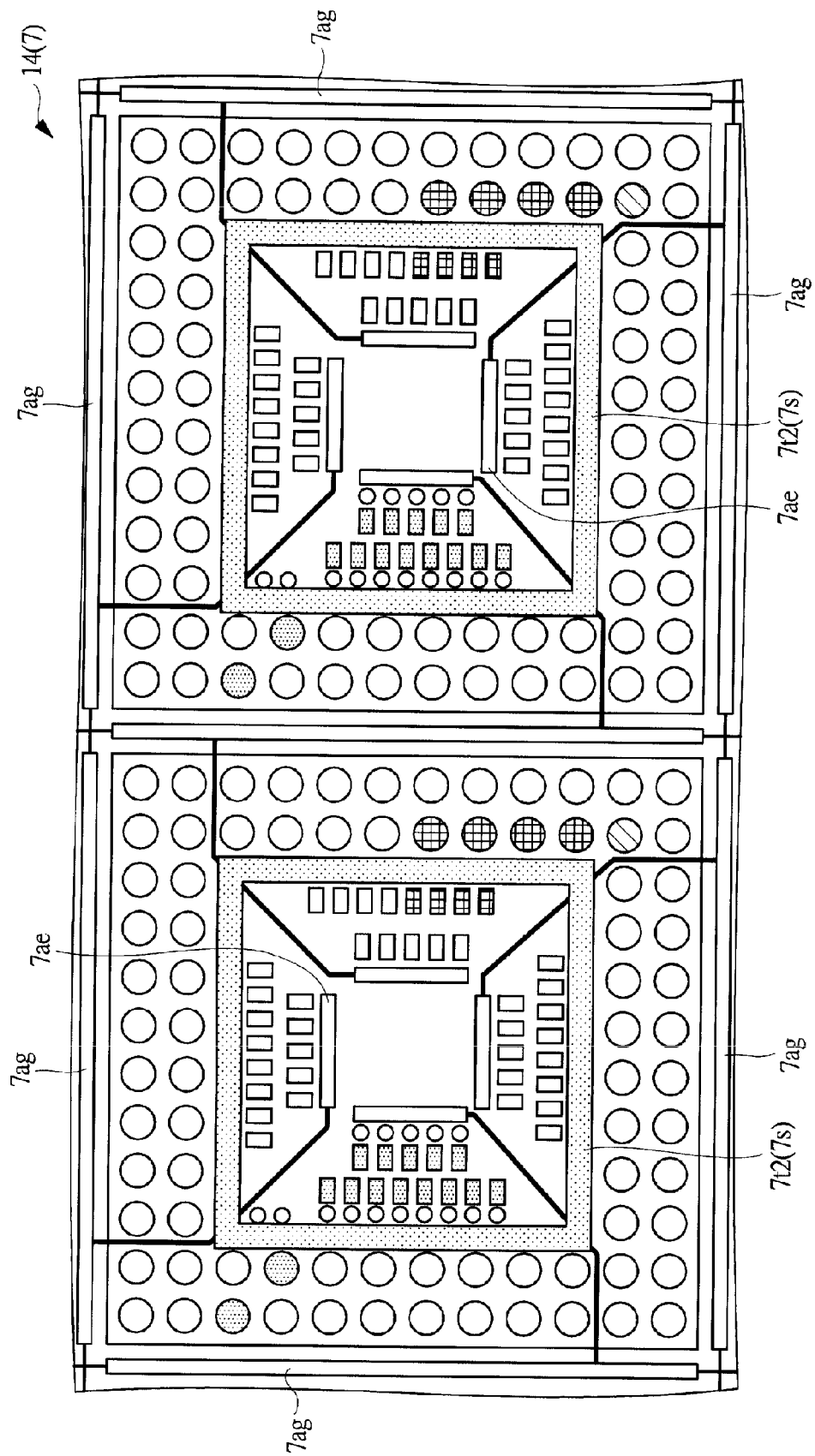
FIG. 14 is a partial plan view illustrating an exemplary structure at the time of the formation of a second front surface-side insulating film of the wiring substrate used for assembling the lower package of FIG. 2.
Figure 15:
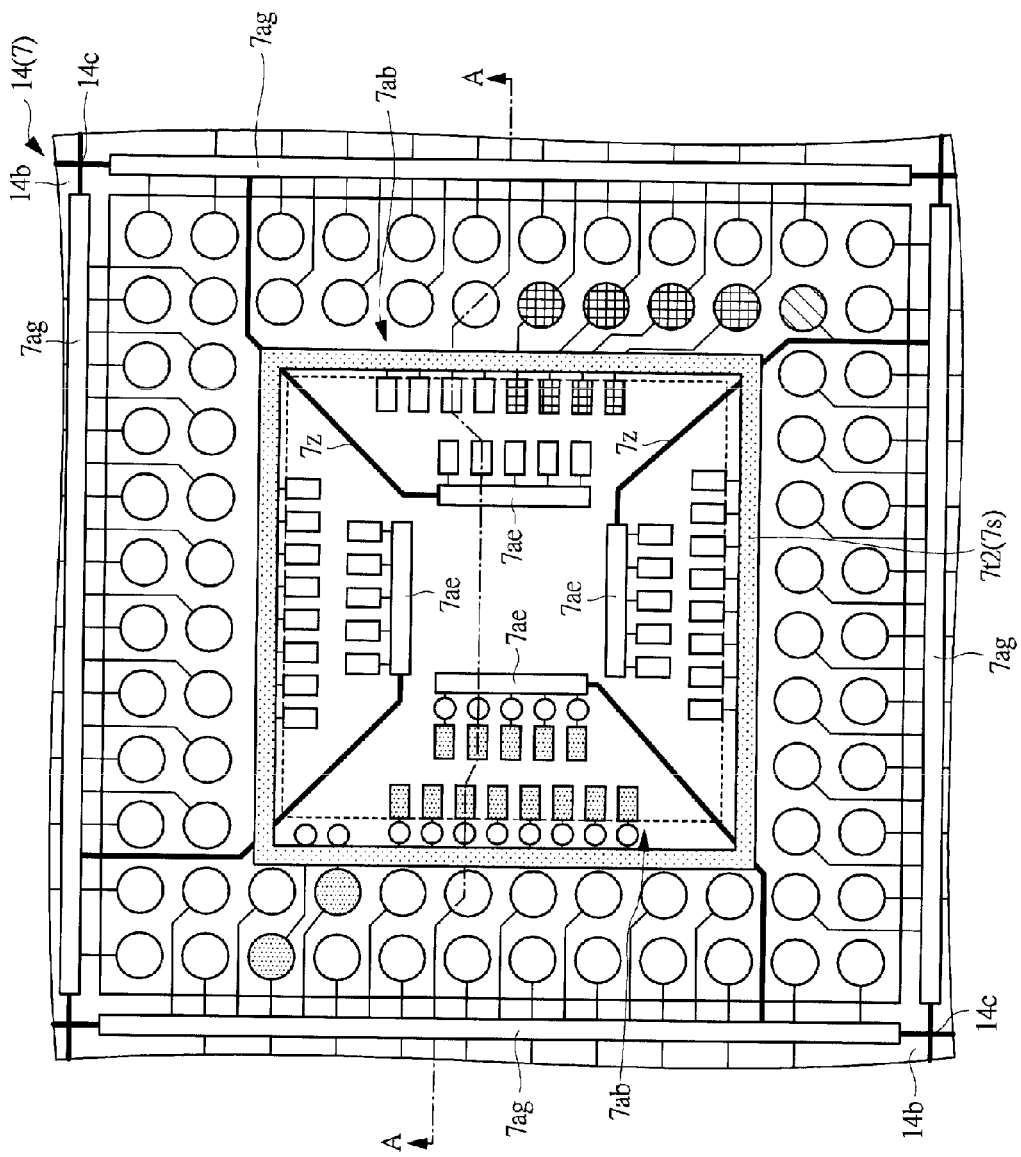
FIG. 15 is an enlarged partial plan view illustrating an exemplary structure of the wiring substrate shown in FIG. 14.
Figure 16:
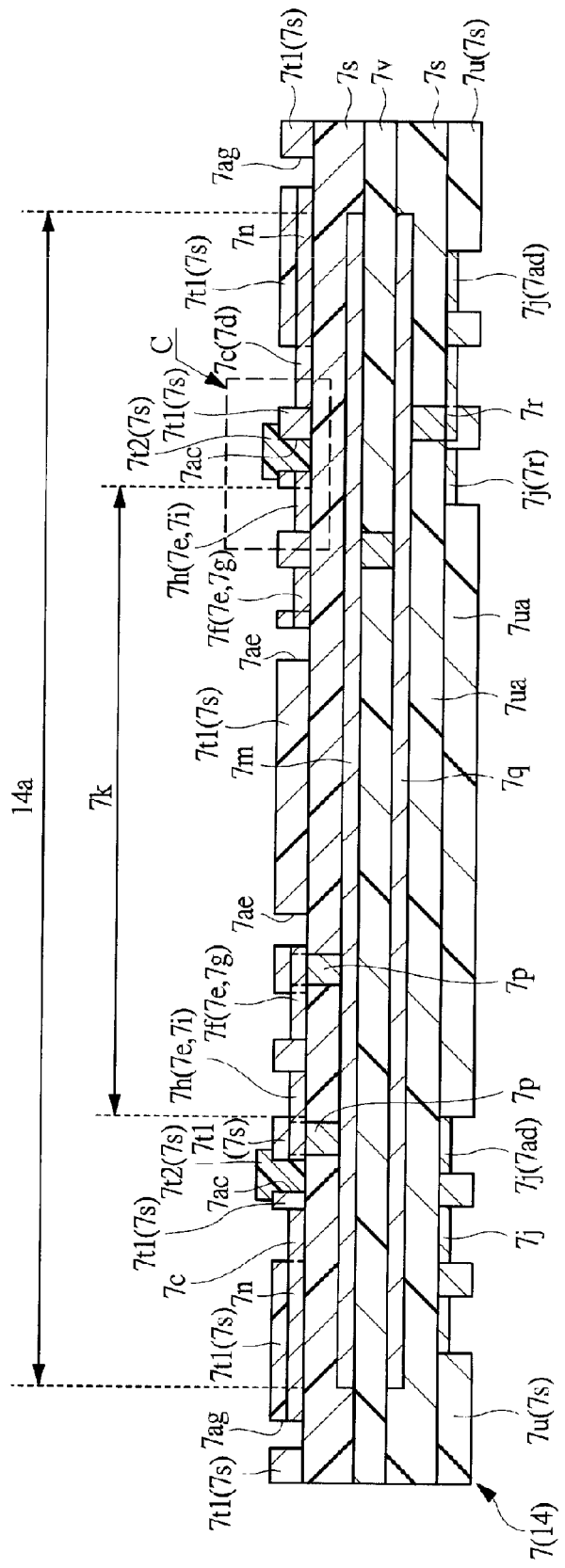
FIG. 16 is a cross-sectional view illustrating an exemplary structure taken along the line A-A of FIG. 15.
Figure 17:
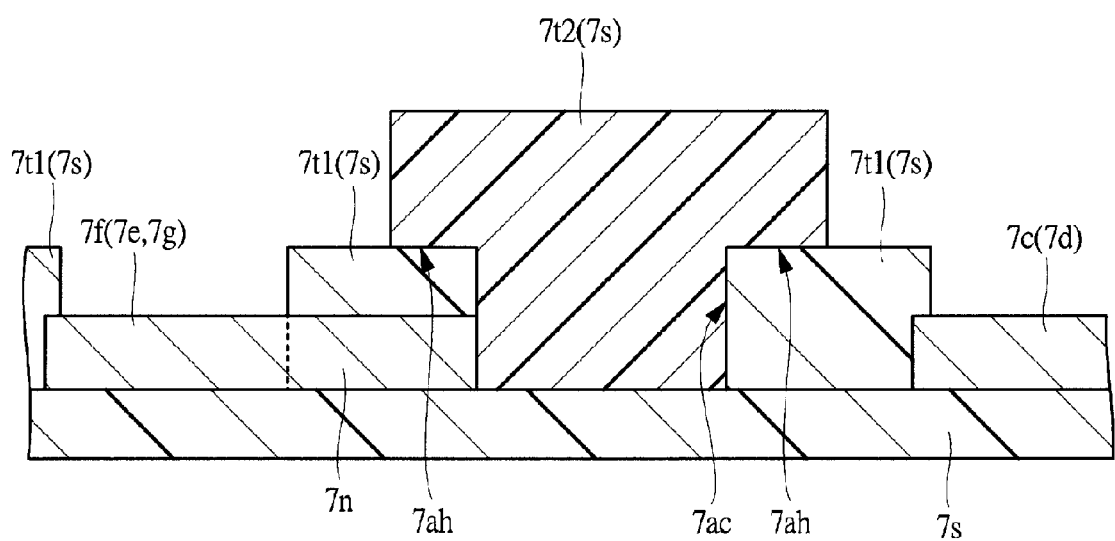
FIG. 17 is an enlarged cross-sectional view illustrating an exemplary structure of the part C of FIG. 16.
Figure 18:
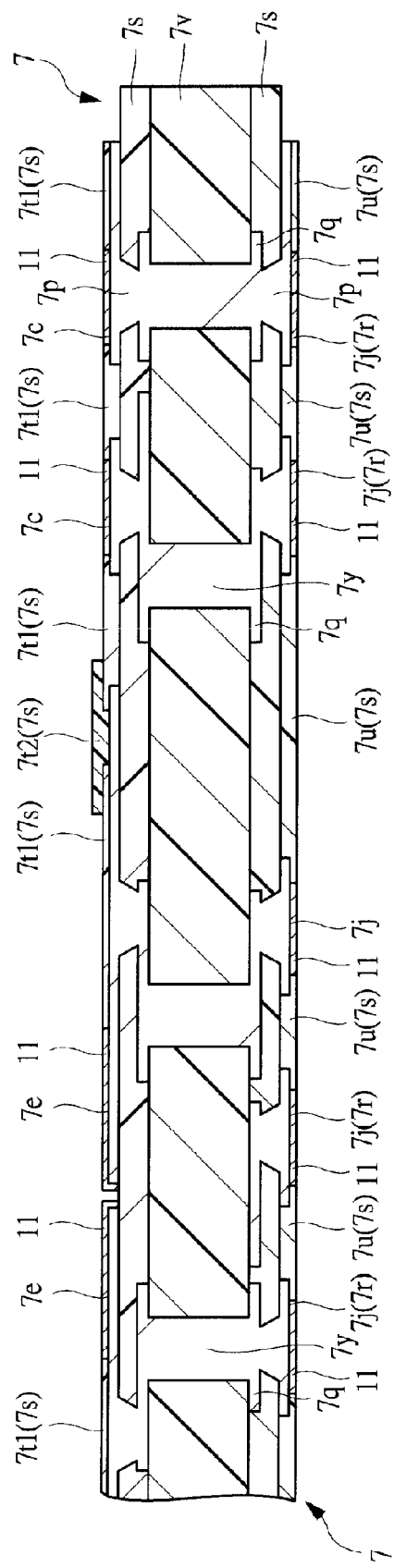
FIG. 18 is a partial cross-sectional view illustrating an exemplary structure after the formation of the second front surface-side insulating film of the wiring substrate used for assembling the lower package of FIG. 2.

FIG. 5 is a partial cross-sectional view illustrating an exemplary structure of the wiring substrate used for assembling the lower package of FIG. 2, FIG. 6 is a partial plan view illustrating an exemplary structure of the wiring substrate used for assembling the lower package of FIG. 2, FIG. 7 is an enlarged partial plan view illustrating an exemplary structure of the wiring substrate shown in FIG. 6, FIG. 8 is a cross-sectional view illustrating an exemplary structure taken along the line A-A of FIG. 7, and FIG. 9 is an enlarged partial cross-sectional view illustrating an exemplary structure taken along the line B-B of FIG. 7. In addition, FIG. 10 is a partial plan view illustrating an exemplary structure after the removal of a power supply line of the wiring substrate of FIG. 6, FIG. 11 is an enlarged partial plan view illustrating an exemplary structure of the wiring substrate shown in FIG. 10, FIG. 12 is a cross-sectional view illustrating an exemplary structure taken along the line A-A of FIG. 11, FIG. 13 is a partial cross-sectional view illustrating an exemplary structure after the formation of the first front surface-side insulating film of the wiring substrate used for assembling the lower package of FIG. 2, and FIG. 14 is a partial plan view illustrating an exemplary structure at the time of formation of the second front surface-side insulating film of the wiring substrate used for assembling the lower package of FIG. 2. Furthermore, FIG. 15 is an enlarged partial plan view illustrating an exemplary structure of the wiring substrate shown in FIG. 14, FIG. 16 is a cross-sectional view illustrating an exemplary structure taken along the line A-A of FIG. 15, FIG. 17 is an enlarged cross-sectional view illustrating an exemplary structure of the part C of FIG. 16, and FIG. 18 is a partial cross-sectional view illustrating an exemplary structure after the formation of the second front surface-side insulating film of the wiring substrate used for assembling the lower package of FIG. 2.

First, the overall structure of the lower substrate 7 will be described. Although the lower substrate 7 is a multi-layer wiring substrate having the insulating film 7s and a plurality of wiring layers stacked respectively on a front surface 7w and a rear surface 7x of a core material 7v which is the base material, as shown in FIG. 3, a case of a multi-layer wiring substrate having four wiring layers (front surface wiring layer, rear surface wiring layer, and two inner layer wirings) will be described in the present embodiment.

The insulating film 7s electrically insulating the wiring layers from each other includes, for example, the core material 7v which is a base material made of prepreg having resin impregnated in glass fiber and the insulating film 7s formed on the core material 7v and made of insulating resin not containing glass fiber. Here, among the insulating films 7s, those formed to expose each of the pre-stack land 7c, the flip-chip land 7e, and the ball land 7j correspond to the solder resist films (front surface-side insulating film and rear surface insulating film) 7t1, 7t2 and 7u, respectively. In addition, the wiring of each of the four wiring layers is made of a conductive film containing copper (Cu) as the major component, for example.

In other words, while the core material 7v is an insulating film made of resin material containing glass fiber (prepreg material), the insulating film (solder resist films (front surface-side insulating films) 7t1 and 7t2) 7s covering the uppermost (first) wiring layer (front surface-side wiring layer) of the wiring layers, and the insulating film (front surface-side insulating film) 7s between the uppermost (first) wiring layer of the wiring layers and a wiring layer (here, the second layer) provided closer to the base material than the uppermost wiring layer are insulating films made of only resin material without containing glass fiber. In addition, the insulating film (solder resist film (rear surface-side insulating film) 7u) 7s covering the lowermost (the fourth) wiring layer of the wiring layers, and the insulating film (rear surface-side insulating film) 7s between the lowermost (the fourth) wiring layer (the rear surface-side wiring layer) of the wiring layers and a wiring layer (here, the third layer) provided closer to the core material 7v than the lowermost wiring layer are similarly insulating films (resin material) made of only resin material without containing glass fiber.

The lower substrate 7 is a substrate for electrolytic plating in which a plating layer (plating film) such as gold (Au) is applied to the flip-chip land 7e and the pre-stack land 7c by electrolytic plating using the power supply line 7z shown in FIG. 6. The flip-chip land 7e and the pre-stack land 7c respectively include a part of the uppermost (first) wiring layer, whereas the land 7j includes a part of the lowermost (the fourth) wiring layer.

Next, the method of manufacturing the lower substrate 7 will be described.

First, after wiring layers (front surface-side wiring layer and rear surface-side wiring layer) 7m and 7q corresponding to the second and third layers have been formed on the front surface and rear surface of the core material (base material) 7v, respectively, the insulating films (front surface-side insulating film and rear surface-side insulating film) 7s are formed such that the wiring layers 7m and 7q are covered. Subsequently, after vias 7p have been formed on the insulating films 7s, wiring layers (front surface-side wiring layer and rear surface-side wiring layer) 7n and 7r corresponding to the first and the fourth layers, which are coupled to the wiring layers 7m and 7q corresponding to the second and third layers respectively through the vias 7p (wirings formed inside the vias 7p), are formed on the insulating films (front surface-side insulating film and rear surface-side insulating film) 7s, as shown in FIG. 5. Here, the wiring layer 7m corresponding to the second layer is coupled to the wiring layer 7q corresponding to the third layer via a through hole 7y (wiring formed inside the through hole 7y).

Next, the insulating films (solder resist film 7t1 and solder resist film 7u) 7s are formed on the wiring layers in and 7r, respectively. Here, the solder resist films 7t1 and 7u of the present embodiment are made of insulating resin which does not contain glass fiber (e.g., epoxy resin) formed in the shape of a film with a thickness of 10 μm, for example.

Subsequently, the insulating films (solder resist films 7t1 and 7u) 7s are exposed and further developed, whereby a MAP (Mold Array Package) substrate 14 shown in FIG. 6 is formed (provided) having the flip-chip land 7e and the pre-stack land 7c exposed in a desired shape.

In the embodiment, a case of using the MAP substrate will be described with regard to the method of manufacturing the lower substrate 7. As shown in FIG. 6, the MAP substrate 14, which is a multi-chip substrate having a plurality of device regions 14a shown in FIGS. 7 and 8 provided thereon, is arranged as a matrix in the plan view in the present embodiment (not shown). In other words, the MAP substrate 14 used in the present embodiment has a plurality of device regions 14a. Furthermore, the power supply line 7z for electrolytic plating is provided in a dicing region 14b formed between the device regions 14a, and the power supply lines (first power supply line 7za, second power supply line 7zb, third power supply line 7zc, fourth power supply line 7zd, and fifth power supply line 7ze) 7z formed on each of the device regions 14a are coupled (electrically coupled) to the power supply line 7z of the dicing region 14b.

In the present embodiment, only two device regions 14a are illustrated for convenience, using a drawing in which other device regions 14a are omitted. In addition, although the MAP substrate 14 used in the present embodiment is described such that the device regions 14a are arranged as a matrix in the plan view, it is not limited thereto and may be arranged as a single column (or a single row).

Furthermore, although only the shared part in the power supply line 7z is illustrated in FIG. 6, excluding the parts not shared, the actual MAP substrate 14 has a number of various power supply lines (7za, 7zb, 7zc, 7zd, and 7ze) 7z formed which are coupled to the flip-chip land 7e and the pre-stack land 7c. In addition, although wirings other than the power supply line 7z are not illustrated in FIG. 6, each of the device regions 14a of the actual MAP substrate 14 has a plurality of wirings provided thereon, which are coupled (linked) to each pre-stack land 7c and each flip-chip land 7e.

Here, the detailed structure of the lower substrate 7 will be described referring to FIGS. 7 to 9.

First, the planar view structure of the front surface 7a of the lower substrate 7 shown in FIG. 7 comprises the front surface 7a having a quadrangular planar shape, the chip-mounting region 7k shown in FIG. 8 provided on the front surface 7a, the first group of lands (first electrode terminal group) 7d formed on the front surface 7a and formed along an end portion (side) 7aa of the front surface 7a, and a second group of lands (second electrode terminal group) 7g and 7i formed on the front surface 7a and formed further inside the first group of lands 7d in the plan view. In addition, the second group of lands 7g and 7i includes the second group of lands 7g on the inner column arranged on the central part of the front surface 7a in the plan view, and the second group of lands 7i on the outer column arranged between the second group of lands 7g on the inner column and the first group of lands 7d in the plan view. In addition, the structure comprises a plurality of power supply lines 7za each being coupled to the first group of lands (pre-stack lands 7c) 7d and extending from each of the pre-stack lands 7c toward the end portion 7aa of the front surface 7a, a plurality of power supply lines 7zb each being coupled to the second group of lands (flip-chip lands 7e) 7i on the outer column and extending from each of the second group of lands (flip-chip lands 7e) 7i on the outer column toward a first region 7ab located between the first group of lands 7d and the second group of lands 7i in the plan view, and a plurality of power supply lines 7zd each being coupled to the second group of lands 7g on the inner column and extending from each of the second group of lands 7g on the inner column toward a second region located in the central part of the front surface 7a in the plan view. Furthermore, the structure comprises a power supply line (shared part) 7zc coupled to each of the power supply lines 7zb, a power supply line (shared part) 7ze coupled to each of the power supply lines 7zd, an opening (groove and recess) 7ac for opening the first region 7ab, and an opening (groove and recess) 7ae for opening the second region, and also has the solder resist film (front surface-side insulating film) 7t1 formed on the front surface 7a such that the first group of lands 7d, the second group of lands 7g and 7i, and the power supply lines (shared part) 7zc and 7ze are exposed, and the power supply lines 7za and the power supply lines 7zb are covered.

In addition, the structure of the rear surface 7b shown in FIG. 8 located opposite to the front surface 7a of the lower substrate 7 includes the lands 7j of the third group of lands 7ad formed on the rear surface 7b and being a third electrode terminal group coupled to the first group of lands 7d and the second group of lands 7g and 7i, respectively, and the insulating film (solder resist film (rear surface-side insulating film) 7u) 7s formed on the rear surface 7b such that the lands 7j of the third group of lands 7ad are exposed.

As shown in FIG. 7, the first region lab of the front surface 7a is arranged along a side of the quadrangular chip-mounting region 7k on the central part or along the end portion 7aa of the front surface 7a in the plan view of the front surface 7a and is further arranged around the chip-mounting region 7k or around the sealing region.

Figure 19:
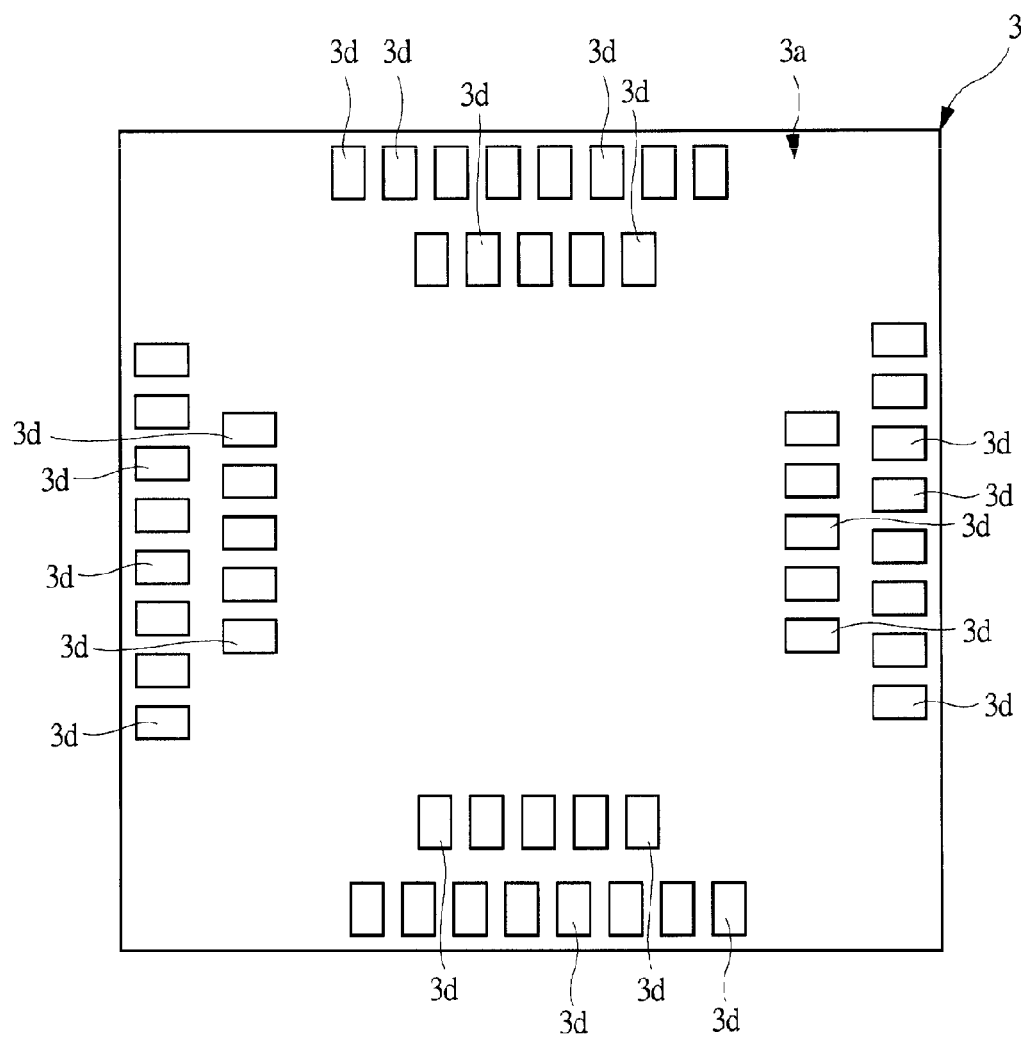
FIG. 19 is a plan view illustrating an exemplary structure of a semiconductor chip mounted on the lower package of FIG. 2.

As thus described, the lower substrate 7 of the present embodiment has the pre-stack lands 7c arranged in a plurality of (two in present the embodiment) columns on the periphery of the front surface 7a, while the chip-mounting region 7k of the central part has the flip-chip lands 7e arranged corresponding to the array of pads 3d of the controller chip 3. Since the POP 1 of the present embodiment has the array of pads 3d of the controller chip 3 arranged in a staggered manner (outer pads 3d and inner pads 3d alternately arranged along the side of the semiconductor chip) as shown in FIG. 19 below to increase the number of pins, accordingly the array of the flip-chip lands 7e is also a staggered array of an inner column and an outer column provided along the circumference of the controller chip 3 (along the side (end portion 7aa) of the lower substrate 7).

In this occasion, since the pitch between adjacent electrodes is narrow (approximately equivalent to the wiring width) in the flip-chip land 7e due to increased number of pins, it has become difficult to draw the power supply line 7z (power supply line 7zb) coupled to the flip-chip lands 7h provided on the outer column between the flip-chip lands 7*f* provided on the inner column.

Therefore, in the plan view, the power supply line 7*zc* which is a shared part of the power supply line 7*z* coupled to the flip-chip lands 7*h* on the outer column is provided in the first region 7*ab* which is a region between the second group of lands 7*g* and 7*i* of the flip-chip land 7*e* provided on the central part, and the first group of lands 7*d* of the pre-stack land 7*c* provided on the periphery, and both of the power supply line 7*zb* coupled to the flip-chip lands 7*h* on the outer column and the power supply line 7*zd* coupled to the flip-chip lands 7*f* on the inner column are coupled to the power supply line 7*zc* which is a shared part of the power supply line 7*z* in the first region 7*ab* (the power supply line 7*zd* is coupled to the power supply line 7*zc* via the power supply line 7*ze*). Furthermore, the power supply line 7*zc* is drawn between the pre-stack lands 7*c* toward the end portion 7*aa* and finally coupled to the power supply line 7*z* of the dicing region 14*b*.

With the lower substrate 7 of the present embodiment, providing the power supply line 7*zc* which is a shared part of the power supply line 7*z* in the first region 7*ab* between the first group of lands 7*d* and the second group of lands 7*g* and 7*i* on the front surface 7*a* allows the power supply line 7*zb* of the flip-chip land 7*h* provided outward among the flip-chip lands 7*e* provided in two columns of the second group of lands 7*g* and 7*i* to be drawn outside the second group of lands 7*i* such that they are coupled to the power supply line 7*zc* of the first region 7*ab*.

Accordingly, the power supply lines 7*z* for the flip-chip lands 7*f* on the inner column and the flip-chip lands 7*h* on the outer column of the second group of lands 7*g* and 7*i* can be separately drawn so that the inner ones of the power supply lines 7*z* are drawn inward and outer ones are drawn outward.

As a result, the power supply lines 7*z* of each electrode can be drawn around even if two columns of the flip-chip lands 7*e* are arranged with a narrow pitch, allowing for the increased number of pins. Accordingly, the number of pins of the POP 1 can be increased (for higher functionality).

In addition, the power supply line 7*z* can be drawn separately for the inner and outer ones of the flip-chip lands 7*e* arranged on two columns of the second group of lands 7*g* and 7*i*. In other words, since the wiring coupled to the second group of lands 7*g* on the inner column is not drawn between the adjacent second lands (flip-chip lands) of the second group of lands 7*i* on the outer column, the pitch between the adjacent second lands (flip-chip lands) can be narrowed, thereby coping with the request for narrower pitches. Accordingly, the second group of lands 7*g* and 7*i* can be arranged further inside, thereby allowing downsizing of the POP 1.

In addition, the flip-chip lands 7*e* of the second group of lands 7*g* and 7*i* are arranged in two columns, namely an inner column and an outer column, and the power supply lines 7*z* are drawn toward separate directions, i.e., inward (power supply line 7*zd*) and outward (power supply line 7*zb*), whereby wiring drawing becomes easier. Particularly, the degree of freedom of wiring drawing in the chip-mounting region 7*k* (central part) is raised so that the flip-chip lands 7*e* can be provided in accordance with the semiconductor chips (controller chips 3) arranged in the staggered pad array in order to narrow the pitch.

The parts E and G shown in FIG. 7 have described therein the pre-stack lands 7*cb* and the flip-chip lands 7*ea* coupled to the vias 7*p*. Although the vias 7*p* respectively corresponding to nearly all the pre-stack lands 7*c* and the flip-chip lands 7*ea* are provided on the wiring substrate 7 used in the present embodiment, only a part of the vias 7*p* (the vias 7*p* corresponding to the pre-stack lands 7*c* and the flip-chip lands 7*e* in the parts E and G) is selectively described in FIG. 7, with description of the other vias 7*p* being omitted.

The pre-stack lands 7*cb* and the flip-chip lands 7*ea* coupled to these vias 7*p* (wirings formed inside the vias 7*p*) are coupled to the land 7*j* on the rear surface 7*b*, for example, through the vias 7*p* (wirings formed inside the vias 7*p*) at the wiring layers 7*m*, 7*n*, 7*q* and 7*r*, and the rear surface 7*b*, as shown in FIG. 8.

In addition, the flip-chip lands 7*f* on the inner column and the flip-chip lands 7*h* on the outer column can be coupled through the vias 7*p* (wirings formed inside the vias 7*p*) and the wiring layer 7*m* of the lower layer (here, the second layer) as shown in FIG. 8, even if the flip-chip lands 7*f* on the inner column and the flip-chip lands 7*h* on the outer column cannot be coupled in the outer layer.

In addition, there may be a case where the power supply lines 7*zc* formed on a single device region 14*a* have a power supply line 7*zc* which has been formed shorter than the power supply lines 7*zc* of other first regions 7*ab* (see part C of FIG. 7). In such a region, the flip-chip lands 7*eb* (7*h*) on the outer column are directly coupled to the grid-like pre-stack land 7*ca* (7*c*) of FIG. 7 via the wiring unit 7*af* by providing wirings in the vacant space left in the first region 7*ab* of the part D, and are further coupled to the power supply line 7*z* of the dicing region 14*b* via the wiring unit 7*af*. In other words, some of the second group of lands 7*g* and 7*i* include the flip-chip lands 7*eb* coupled to any of the pre-stack lands 7*c* (pre-stack lands 7*ca*) of the first group of lands 7*d* via the wiring (wiring unit 7*af*) formed on the wiring layer 7*n*, without being coupled to the power supply line 7*zb*.

In other words, a vacant space can be secured to pass wirings such as the wiring unit 7*af* to the first region 7*ab* if the power supply line 7*zc* is intermittently provided, whereby wiring drawing becomes easier. For example, as shown in FIG. 9, the flip-chip land 7*eb* and the pre-stack land 7*ca* can be directly coupled by the wiring unit 7*af*, and further, the pre-stack land 7*ca* and the power supply line 7*z* of the dicing region 14*b* can be coupled by the wiring unit 7*af*. This structure is effective in that the flip-chip land 7*eb* can be coupled directly to the memory chip 10 of the upper package 9 via the pre-stack land 7*ca* to be used for a control signal wiring of the memory chip 10 of the upper package 9.

In addition, the pre-stack land 7*cc* indicated by hatching in the part F of FIG. 7 is the pre-stack land 7*c* provided near the power supply line coupled to the power supply line 7*z* of the dicing region 14*b*, and the pre-stack land 7*cc* thus provided near the power supply line may be directly coupled to the divided power supply line 7*z* after the power supply line 7*z* is divided.

Next, the structure of the lower substrate 7 along its thickness direction will be described.

The lower substrate 7 has therein the core material (base material) 7*v* having a front surface 7*w* and a rear surface 7*x* as shown in FIG. 8. The front surface 7*w* of the core material 7*v* has formed thereon the wiring layer (front surface-side wiring layer) 7*m* formed on the front surface 7*w* of the core material 7*v*, the insulating film 7*s* formed over the wiring layer 7*m*, the wiring layer (front surface-side wiring layer) 7*n* formed over the wiring layer 7*m* and coupled to the wiring layer 7*m* through the via 7*p* (wirings formed inside the via 7*p*), and the insulating film (solder resist film 7*t*1) 7*s* which is an front surface-side insulating film formed over the wiring layer 7*n*.

On the other hand, the rear surface 7*x* of the core material 7*v* has formed thereon, the wiring layer (rear surface-side wiring layer) 7*q* formed on the rear surface 7*x* and coupled to the wiring layer 7*m*, the insulating film (solder resist film 7*u*) 7*s* formed under the wiring layer 7*q*, the wiring (rear surface-side wiring layer) 7r formed under the insulating film (solder resist film 7u) 7s and coupled to the wiring layer 7q through the via 7p (wirings formed inside the via 7p), and the insulating film (solder resist film 7u) 7s formed under the wiring layer 7r.

Here, the core material 7v is made of prepreg material which is first insulating resin material containing glass fiber, whereas the insulating film (solder resist film 7t1 and solder resist film 7u) 7s is made of a second insulating resin material which does not contain the glass fiber. The second resin material is epoxy resin, for example. Therefore, the second resin material is weaker in strength than the first resin material. Since the insulating film (solder resist film 7t1 and solder resist film 7u) 7s is made of resin only, the insulating film can be formed (processed) to allow for narrow-pitch wiring. Although the insulating film 7s in the present embodiment is described as being made of insulating resin which does not contain glass fiber, the invention is not limited thereto and insulating resin containing glass fiber such as the core material 7v may be used when a high processing precision is not required. Accordingly, strength (rigidity) of the wiring substrate 7 can be enhanced.

Electrolytic plating is applied to the MAP substrate 14 shown in FIG. 6 having the above-mentioned structure, using the power supply line 7z. Here, the plating layer (plating film) 11 (see FIG. 13) is formed by electrolytic plating on the surface of the first group of lands 7d and the second group of lands 7g and 7i exposed from the insulating film (solder resist film 7t1) 7s which is the first front surface-side insulating film shown in FIG. 8.

First, a resist film, which serves as a mask in performing electrolytic plating, is coated to form a resist film over the solder resist film 7s, and resist exposure and development are subsequently preformed to remove the unnecessary resist film.

Subsequently, a plating layer 11 such as gold is formed on the surface of the flip-chip lands 7e of the second group of lands 7g and 7i, and the pre-stack lands 7c of the first group of lands 7d by electrolytic plating, with the resist film serving as a mask, and the resist film used as the mask is removed after the plating layer has been formed.

Subsequently, etchback is performed to separate the power supply lines 7z. The etchback is a technology of removing the wirings by etching, and the shared part (a part of the power supply line 7z, the third power supply line 7zc, and the fifth power supply line 7ze) of the power supply line 7z (wiring) is removed by etching, in the present embodiment.

First, a resist film which serves as a mask in performing the etchback is coated to form a resist film over the insulating film 7s, and resist exposure and development are subsequently preformed to remove the unnecessary resist film.

Subsequently, the power supply line 7z exposed in the opening 7ag of the dicing region 14b, the power supply line 7zc exposed in the opening 7ac of the first region 7ab, and the power supply line 7ze exposed in the opening 7ae of the central part shown in FIG. 7 are removed by etching, with the resist film serving as a mask, and the resist film used as the mask is removed after the power supply lines have been removed.

Here, FIGS. 10 to 13 illustrate the structure of the MAP substrate 14 after the removal of the power supply lines, where the upper layer insulating film 7s is exposed from the insulating film (solder resist film 7t1) 7s covering the first layer wiring layer 7n in each of the opening 7ag of the dicing region 14b, the opening 7ac of the first region 7ab, and the opening 7ae of the central part, as shown in FIG. 12.

The removal process of each power supply line of the present embodiment is performed so that a corner of the dicing region 14b, i.e., cross point 14c where the power supply lines 7z intersect on the MAP substrate 14 remains, as shown in FIG. 10.

As a variation, however, the amount of metal in the dicing region 14b can be reduced by removing the cross point 14c together in removing the power supply lines, whereby the degree of abrasion of a blade 16 used in cutting the package into pieces in the dicing process can be reduced, extending the lifetime of the blade 16.

In addition, although a case of removing the shared part (wiring of the power supply line or the like) by etching is described in the present embodiment, the method of removing the shared part is not limited to the use of etching and may use a laser beam, a router (blade 16), or water jet to remove the shared part of the power supply line.

After the etchback has been completed, the insulating film (solder resist film 7t2) 7s is formed. Here, the insulating film (solder resist film 7t2) 7s is formed on the insulating film (solder resist film 7t1) 7s, as shown in FIGS. 14 to 16, such that the inside of the opening 7ac of the first region 1ab shown in FIG. 7 is filled and the first group of lands 7d and the second group of lands 7g and 7i are exposed.

The insulating film (solder resist film 7t2) 7s is also made of insulating resin which does not contain glass fiber, similarly to the insulating film (solder resist film 7t1) 7s covering the wiring layer in on the outmost layer (first layer), and the resin is epoxy resin, for example. In addition, although the insulating film (solder resist film 7t2) 7s is preferably formed by dropping flowable (paste-like) resin, the solder resist film 7t2 may be formed using a film-like insulating material.

In addition, the insulating film (solder resist film 7t2) 7s can be formed (processed) with an insulation material containing only resin to allow for narrow-pitch wiring.

In forming the solder resist film (front surface-side insulating film) 7t2, solder resist film (front surface-side insulating film) 7t2 is first coated on the solder resist film 7t1, and subsequently the solder resist film 7t2 is exposed and developed to be formed into a desired shape.

Here, the solder resist film 7t2 is formed circularly around the chip-mounting region 7k of FIG. 16, i.e., around the external circumference of the second group of lands 7g and 7i, as shown in FIGS. 14 and 15. Forming the solder resist film 7t2 circularly almost certainly prevents the underfill material (sealing material) 6 from reaching the pre-stack land 7c, even if the underfill material (sealing material) 6 used in mounting the semiconductor chip on the wiring substrate 7 flows out of the chip-mounting region 7k. Here, although the effect of preventing outflow of the die-bonding material can be exhibited where the solder resist film 7t2 is formed, there exists a risk that the die-bonding material may flow out through a part where the solder resist film 7t2 is not formed, even if the solder resist film 7t2 is not circularly formed in the plan view, in other words, if the solder resist film 7t2 is divided into pieces, and therefore it is preferred that the solder resist film 7t2 is monolithically formed as shown in FIGS. 14 and 15.

Only considering an anti-crack measure for the wiring substrate 7 described above, the solder resist film 7t2 needs not necessarily be formed monolithically. In other words, the solder resist films 7t2 formed along each side of the semiconductor chip to fill the opening 7ac needs not be connected each other as long as the opening 7ac formed on the solder resist film 7t1 to remove the power supply line (shared part) is covered. However, a cause of generation of cracks is that the thickness of the wiring substrate 7 has become thin due to the demand for thinner semiconductor devices. In other words, this is because thinning of the wiring substrate 7 has degraded the strength (rigidity) of the wiring substrate 7. Therefore, it is preferred to form the solder resist film 7t2 monolithically as shown in FIGS. 14 and 15 to enhance the strength (rigidity) of the wiring substrate 7.

Additionally, in order to cause the solder resist film 7t2 to function as a bleed preventing dam, it is desirable not only to fill the opening 7ac shown in FIG. 12 with the solder resist film 7t2 but also to form the solder resist film 7t1 with increased thickness. In other words, as shown in FIGS. 16 and 17, the solder resist film 7t2 is formed so that thickness of the solder resist film 7t2 is larger than that of the solder resist film 7t1. For example, the solder resist film 7t2 is formed with a thickness of about 25 μm.

As thus described, forming the solder resist film 7t2 to be thicker than the solder resist film 7t1 can further enhance the effect of preventing bleed, as well as preventing occurrence of cracks in the opening 7ac when a thermal stress is applied to the opening 7ac.

This is because forming the solder resist film 7t2 of the present embodiment to be thicker than the solder resist film 7t1 can prevent the generation of a starting point of a crack on the surface of the solder resist film 7t2 from where the crack starts, whereas simply filling the opening 7ac with resin (solder resist film 7t2) may leave the surface of the insulating film on the filled position lower than the surface of the insulating film around its periphery to generate a dent therebetween, in which case the dent on the surface of the insulating film on the filled position may again become the starting point of cracks.

If the opening 7ac is not filled with the solder resist film 7t2 and the surface of the lower solder resist film 7t1 is exposed, it is a serious state in that the frequency of occurrence of cracks is very high. Particularly, the strength is lower than the prepreg material because the solder resist film 7t2 and the solder resist film 7t1 are insulating films made of resin only. Although using the prepreg material for the insulating films (solder resist films 7t1 and 7t2) 7s as with the core material 7v can enhance the strength (rigidity) of the wiring substrate 7 to some extent, it is difficult to completely suppress occurrence of cracks.

Therefore, although it is essential, as an anti-crack measure of the wiring substrate 7, to fill the opening 7ac with the solder resist film 7t2, it is desirable to at least raise the surface of the solder resist film 7t2 to the same as or higher (protruding) than the surface of the solder resist film 7t1.

In addition, it is preferred that the solder resist film 7t2 is formed to have a position overlapping the solder resist film 7t1 (overlapping region 7ah) around the opening 7ac of the first region 7ab, as shown in FIG. 17. In other words, it is preferred to form the insulating film (solder resist film 7t2) 7s to have a position overlapping the insulating film (solder resist 7t1) 7s around the periphery of the opening 7ac formed on the insulating film (solder resist 7t1) 7s.

Accordingly, alignment of the solder resist film 7t2 against the opening 7ac in coating the solder resist film 7t2 can be easily performed.

Manufacturing of the MAP substrate 14 having the opening 7ac covered with the solder resist film 7t2 as shown in FIGS. 14 to 18 is completed as thus described.

Next, the semiconductor chip mounted on the lower substrate 7 will be described.

FIG. 19 is a plan view illustrating an exemplary structure of a semiconductor chip mounted on the lower package 2 of FIG. 2.

The semiconductor chip mounted on the lower package 2 is the controller chip 3 shown in FIG. 19, which controls the memory chip 10 built in the upper package 9 as shown in FIG. 1, as well as transmitting and receiving electrical signals to and from external electronic devices.

As shown in FIG. 19, the controller chip 3 comprises the main surface (the front surface) 3a having a quadrangular planar shape, the pads (bonding pads) 3d formed on the main surface 3a, and the rear surface 3b opposite to the main surface 3a.

The semiconductor device of the present embodiment is the POP 1 as shown in FIG. 1, with an increased number of pins. Therefore, although the pads 3d are also arranged on the main surface 3a of the controller chip 3 with a narrow pad pitch, not all the pads 3d are shown in FIG. 19, with some of them being omitted, for convenience. In other words, the pads 3d are crammed in two columns arranged in a staggered array on the main surface 3a of the controller chip 3.

The controller chip 3 is made of silicon and therefore, its thermal expansion coefficient ($\alpha$) is different from that of resin such as the solder resist film 7t1 and the solder resist film 7t2.

On the lower package 2, the controller chip 3 is coupled to the lower substrate 7 by flip-chip coupling.

Next, the upper package 9 built in the semiconductor device (POP 1) of the present embodiment will be described.

As shown in FIG. 1, the upper package 9 comprises the upper substrate 13 having the front surface 13a and the rear surface 13b opposite to therewith, the memory chip 10 which is a semiconductor chip mounted on the central part (chip-mounting region) of the front surface 13a of the upper substrate 13 via the die-bonding materials (adhesive agent and sealing material) 17, the wires 15 (e.g., gold lines) which are the conductive members coupling the pad 10c of the memory chip 10 and the bonding lead 13c of the upper substrate 13, and the sealing body 12 which seals the memory chip 10 and the wires 15 using resin.

In other words, on the upper package 9, the memory chip 10 is face-up mounted on the upper substrate 13 so that its rear surface 10b faces the front surface 13a of the upper substrate 13, and the memory chip 10 is coupled to the upper substrate 13 by wire coupling.

Next, the upper substrate 13 built in the upper package 9 of the POP 1 will be described.

As shown in FIG. 1, the upper substrate 13 comprises the front surface 13a having a quadrangular planar shape, the bonding leads 13c formed on the front surface 13a, the rear surface 13b opposite to the front surface 13a, and the lands 13d formed on the rear surface 13b. In addition, the upper substrate 13 has the core material 13e inside it, the wiring layers 13f are formed on both the front surface and the rear surface thereof, and the solder resist film 13g which is the insulating film covering each of the wiring layers 13f is also formed on both the front surface and the rear surface.

In addition, the wiring of the wiring layer 13f on the front surface and the wiring of the wiring layer 13f on the rear surface are coupled to each other via the through hole 13h.

The bonding leads 13c which are a part of the wiring layer 13f on the front surface are arranged in accordance with the pad 10c of the memory chip 10 mounted on the upper substrate 13. On the other hand, the lands 13d which are a part of the wiring layer 13f on the rear surface are arranged in accordance with the position of the pre-stack lands 7c on the front surface 7a of the lower substrate 7 so that they are coupled to each of the pre-stack lands 7c on the front surface 7a of the lower substrate 7 of the lower package 2 via the solder ball 8.

Next, the memory chip 10 which is a semiconductor chip mounted on the upper substrate 13 will be described. The memory chip 10, which is controlled by the controller chip 3 built in the lower package 2 as shown in FIG. 1, comprises the main surface 10a having a quadrangular planar shape, the pads 10c formed on the main surface 10a, and the rear surface 10b opposite to the main surface 10a.

In addition, the memory chip 10 is also made of silicon as with the controller chip 3, and therefore has a thermal expansion coefficient (α) which is different from that of resin such as the solder resist film 13g.

On the upper package 9, the memory chip 10 is face-up mounted over the upper substrate 13, and coupled to the upper substrate 13 by wire coupling.

Next, assembling of the semiconductor device (POP 1) of the present embodiment will be described.

Figure 20:
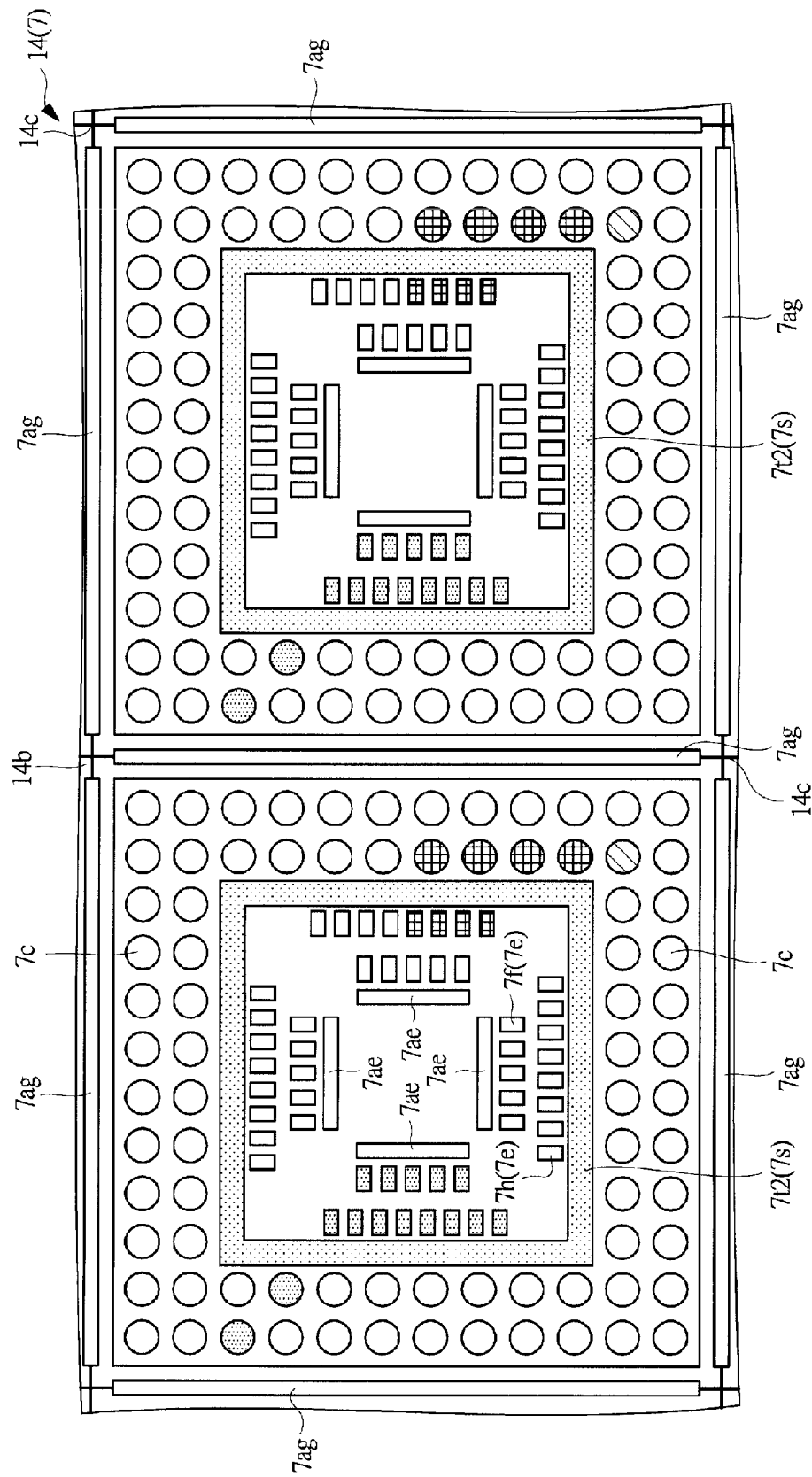
FIG. 20 is a partial plan view illustrating an exemplary structure of the wiring substrate used for assembling the lower package of the semiconductor device of FIG. 1.
Figure 21:
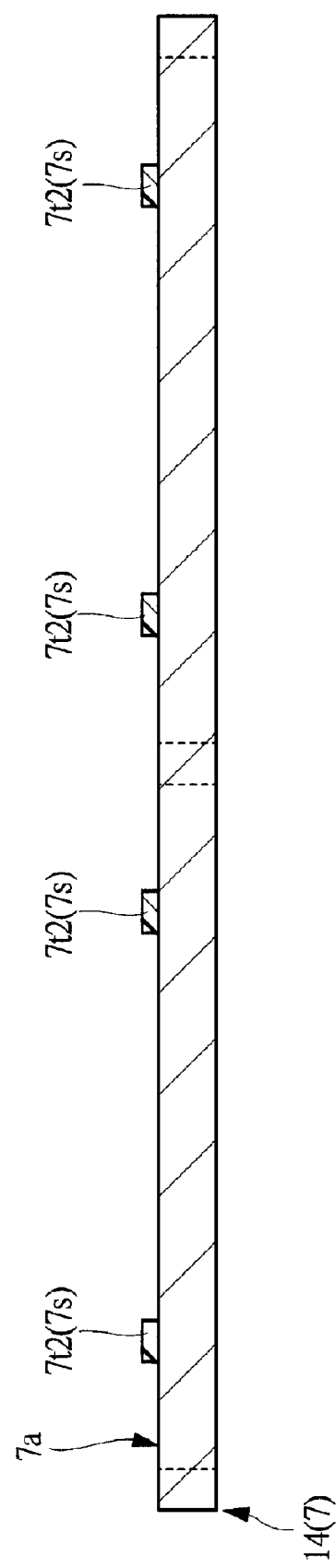
FIG. 21 is a partial cross-sectional view illustrating an exemplary structure of the wiring substrate shown in FIG. 20.
Figure 22:
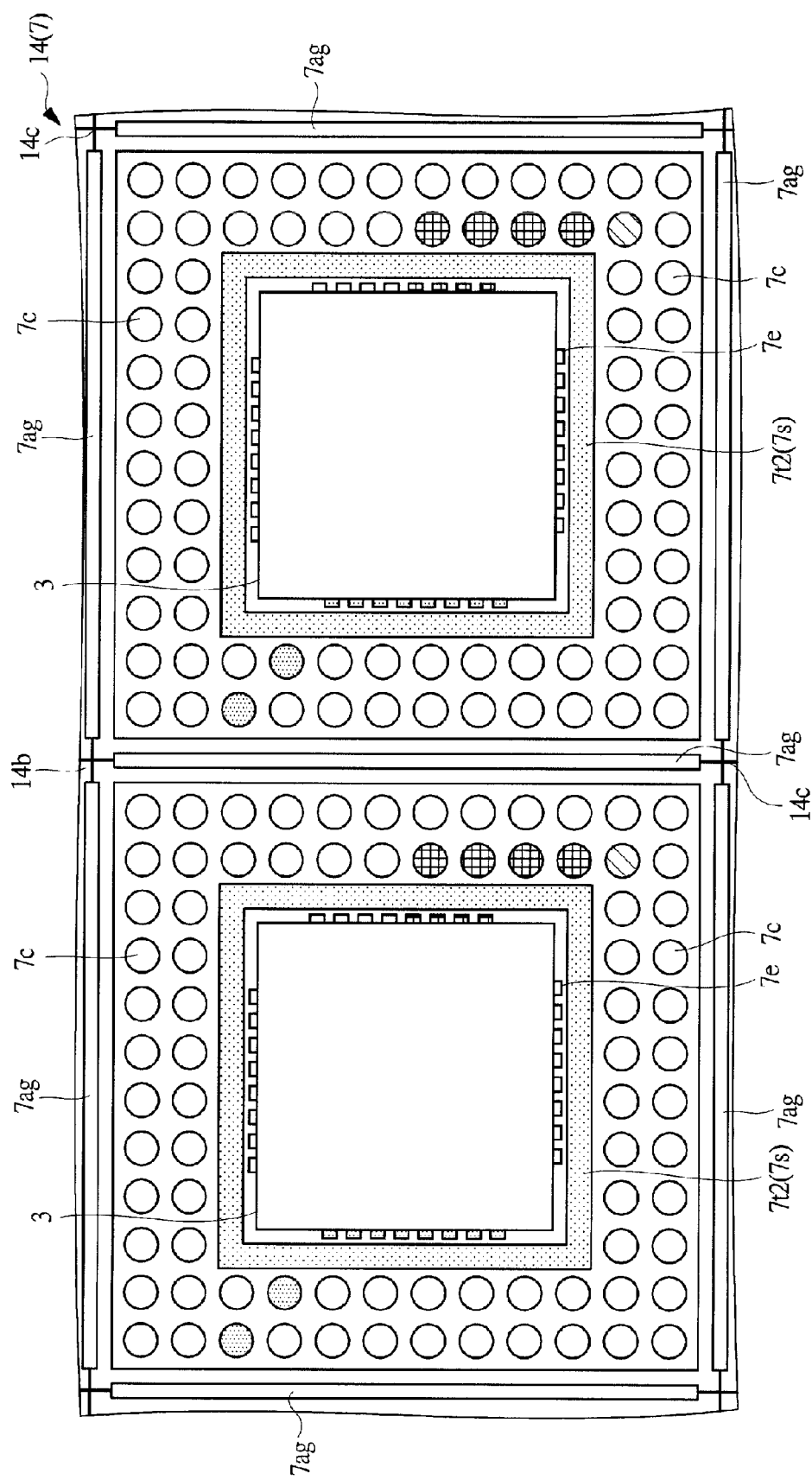
FIG. 22 is a partial plan view illustrating an exemplary structure of the wiring substrate after die-bonding in the assembling of the lower package of the semiconductor device of FIG. 1.
Figure 23:
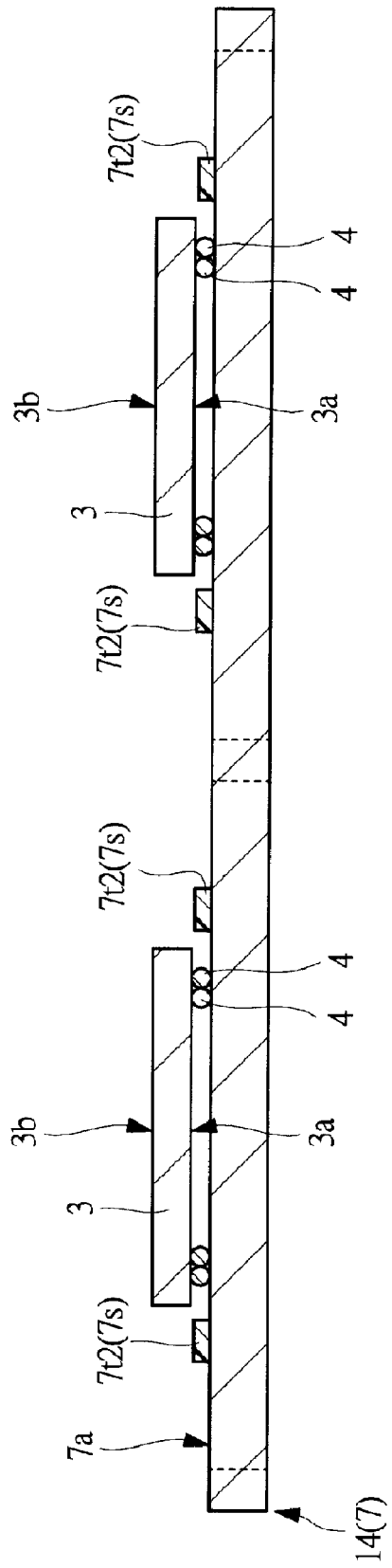
FIG. 23 is a partial cross-sectional view illustrating an exemplary structure of the wiring substrate shown in FIG. 22.
Figure 24:
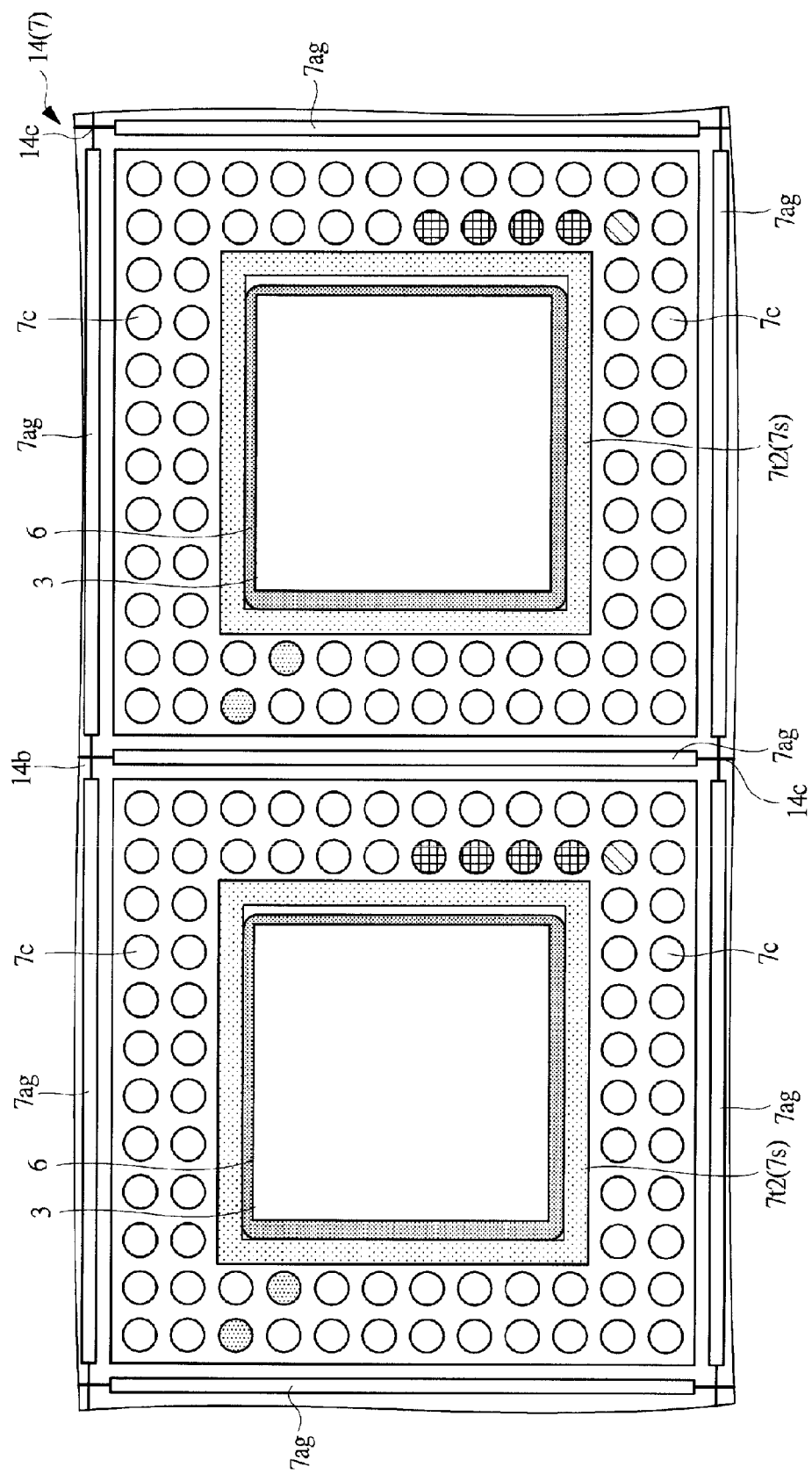
FIG. 24 is a partial plan view illustrating an exemplary structure of the wiring substrate after underfilling in the assembling of the lower package of the semiconductor device of FIG. 1.
Figure 25:
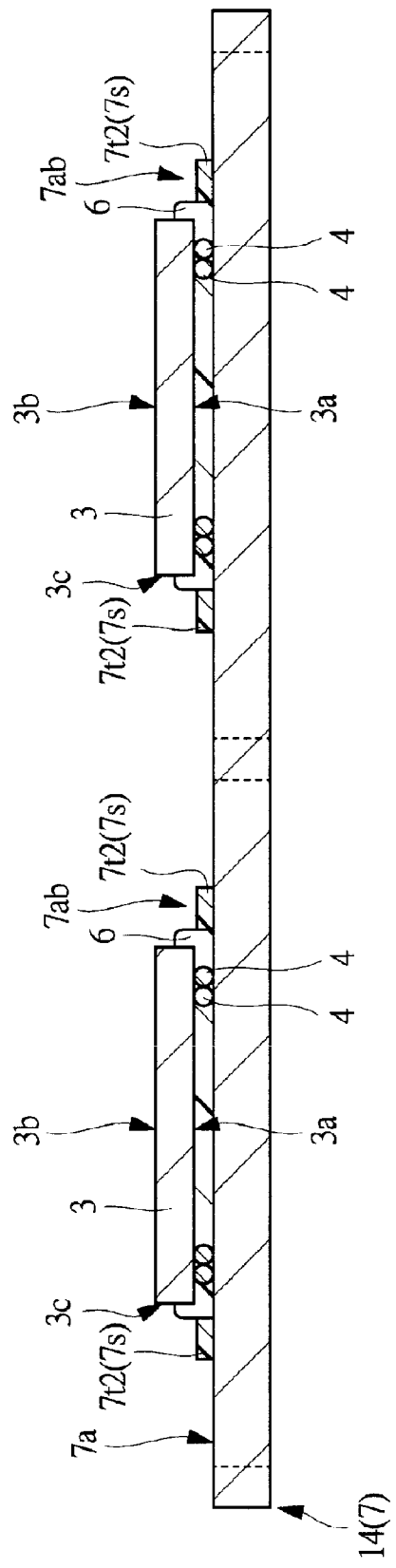
FIG. 25 is a partial cross-sectional view illustrating an exemplary structure of the wiring substrate shown in FIG. 24.
Figure 26:
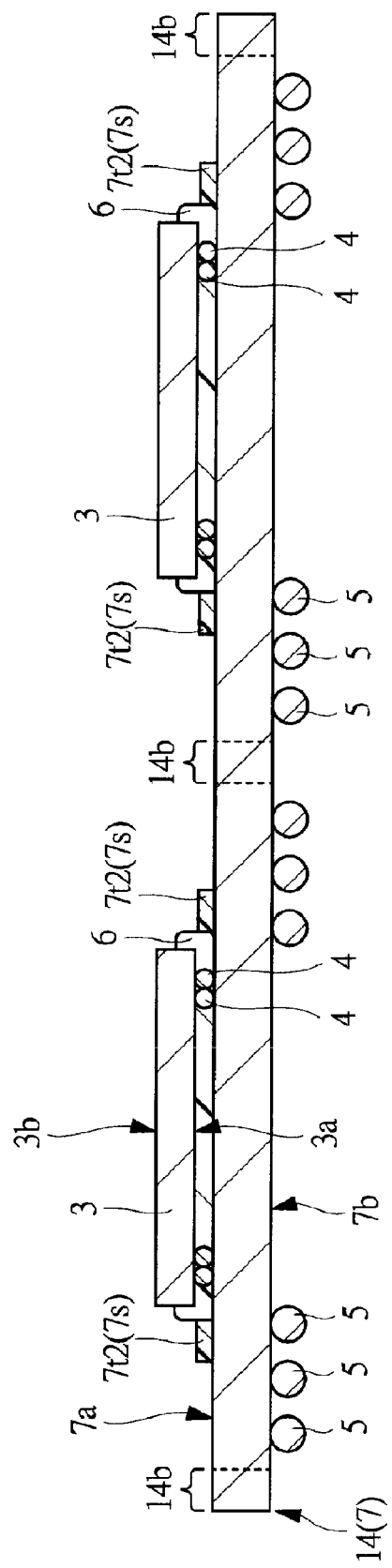
FIG. 26 is a partial cross-sectional view illustrating an exemplary structure of the wiring substrate after ball joining in the assembling of the lower package of the semiconductor device of FIG. 1.
Figure 27:
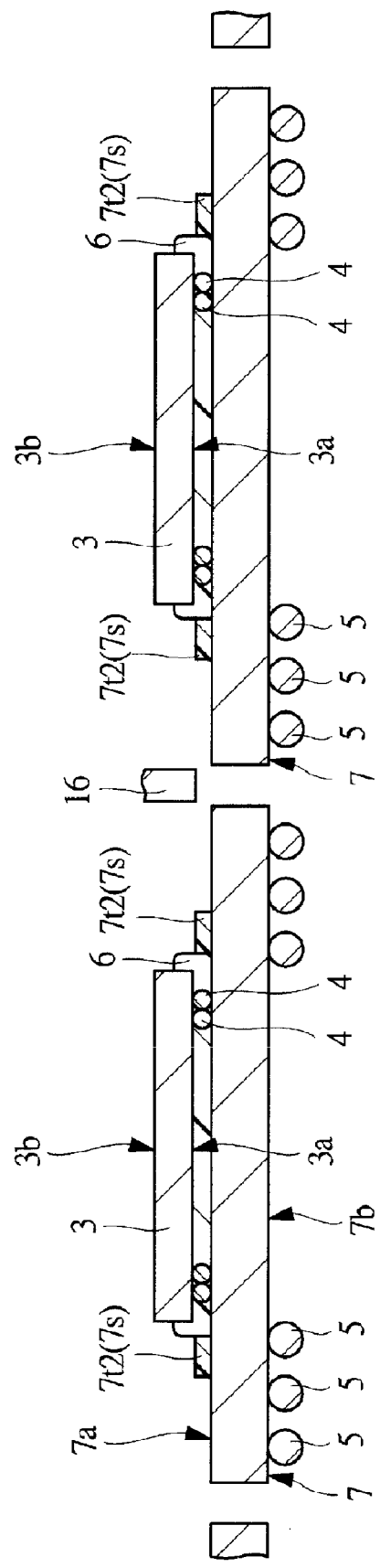
FIG. 27 is a partial cross-sectional view illustrating an exemplary structure of the wiring substrate after dicing in the assembling of the lower package of the semiconductor device of FIG. 1.
Figure 28:
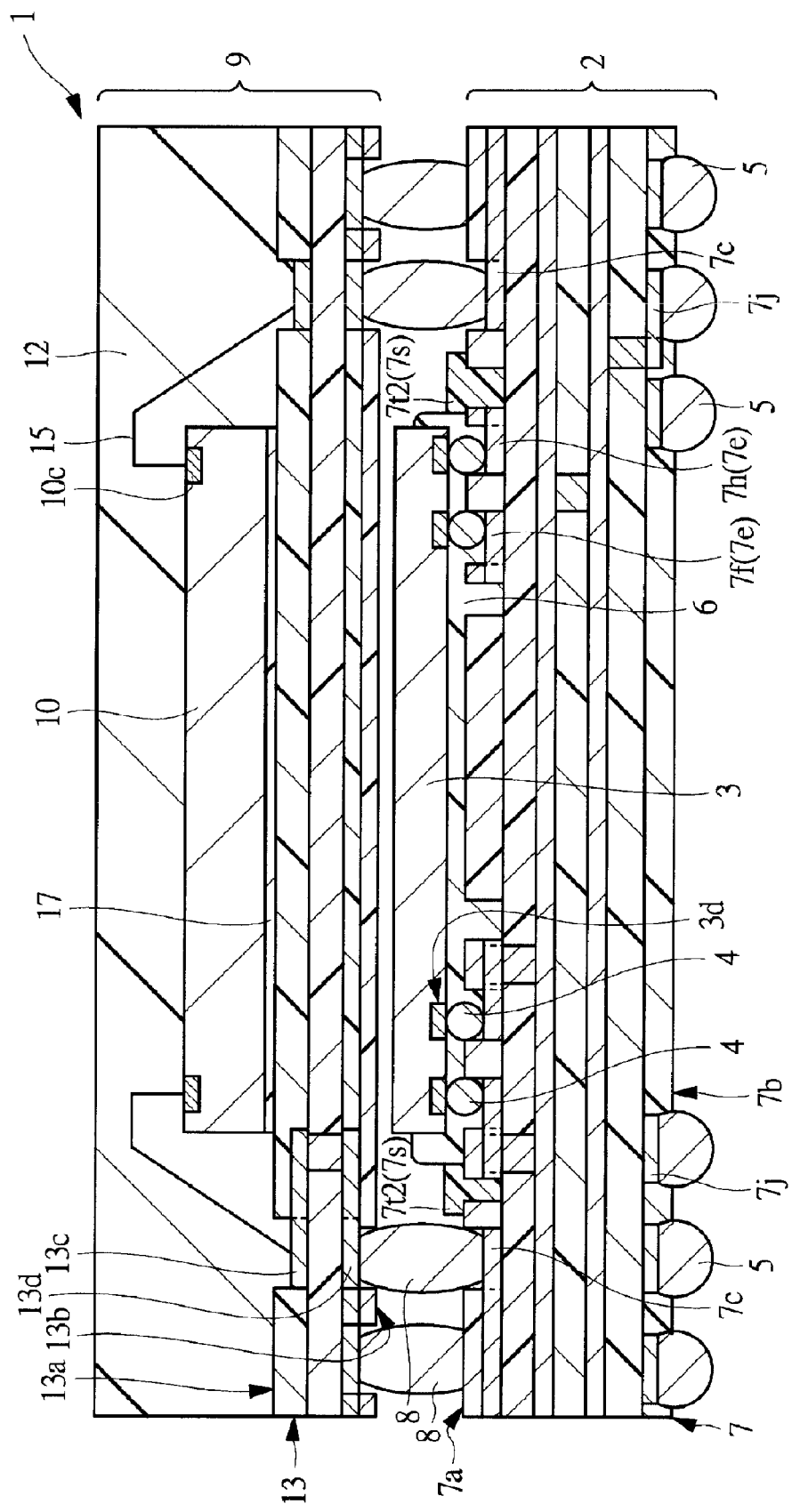
FIG. 28 is a cross-sectional view illustrating an exemplary structure of the semiconductor device according to an embodiment of the present invention.
Figure 29:
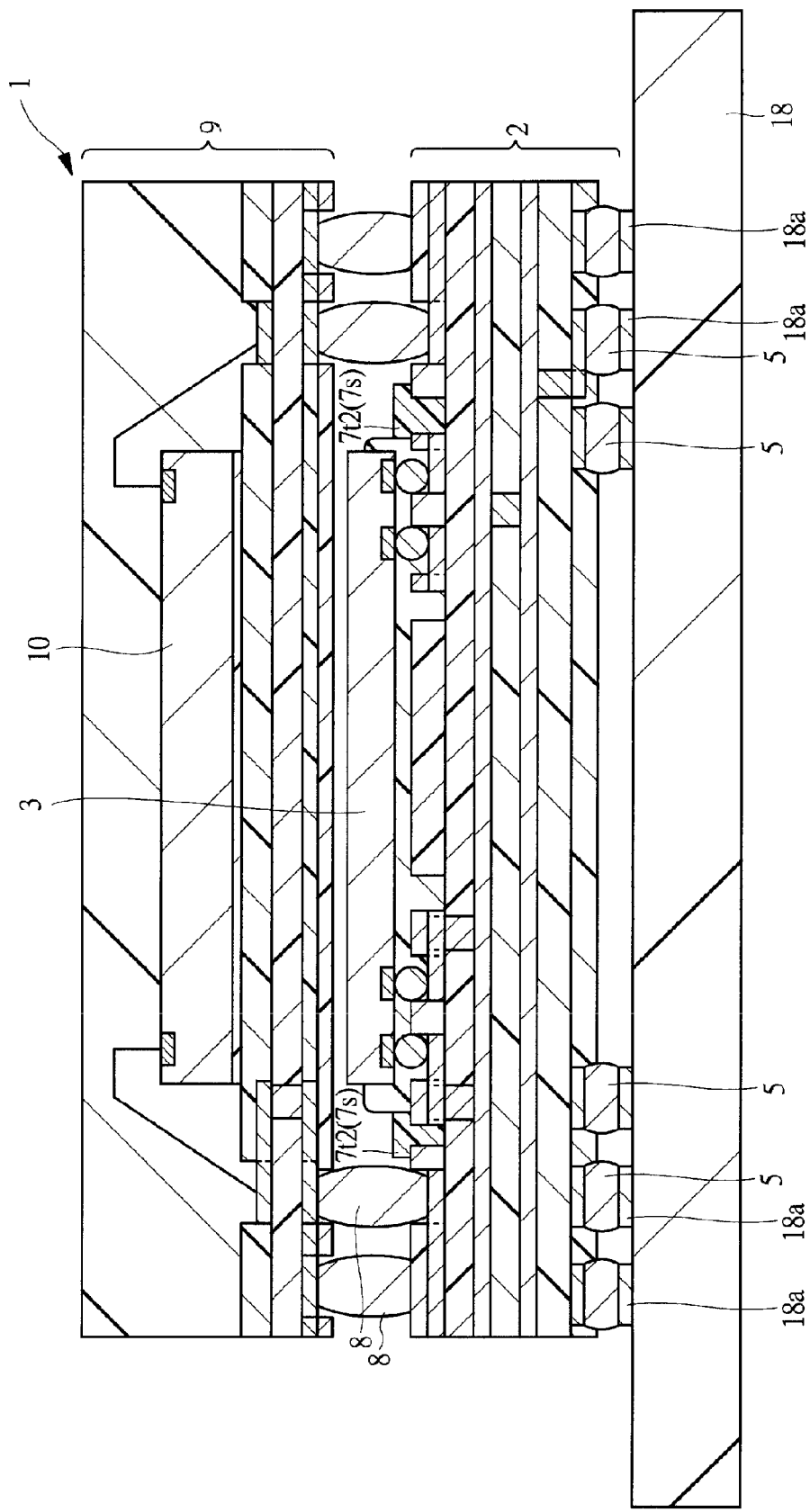
FIG. 29 is a cross-sectional view illustrating an exemplary mounting structure of the semiconductor device shown in FIG. 28.

FIG. 20 is a partial plan view illustrating an exemplary structure of the wiring substrate used for assembling the lower package of the semiconductor device of FIG. 1, FIG. 21 is a partial cross-sectional view illustrating an exemplary structure of the wiring substrate shown in FIG. 20, FIG. 22 is a partial plan view illustrating an exemplary structure of the wiring substrate after die-bonding in the assembling of the lower package of the semiconductor device of FIG. 1, and FIG. 23 is a partial cross-sectional view illustrating an exemplary structure of the wiring substrate shown in FIG. 22. In addition, FIG. 24 is a partial plan view illustrating an exemplary structure of the wiring substrate after underfilling in the assembling of the lower package of the semiconductor device of FIG. 1, and FIG. 25 is a partial cross-sectional view illustrating an exemplary structure of the wiring substrate shown in FIG. 24. Furthermore, FIG. 26 is a partial cross-sectional view illustrating an exemplary structure of the wiring substrate after ball joining in the assembling of the lower package of the semiconductor device of FIG. 1, FIG. 27 is a partial cross-sectional view illustrating an exemplary structure of the wiring substrate after dicing in the assembling of the lower package of the semiconductor device of FIG. 1, FIG. 28 is a cross-sectional view illustrating an exemplary structure of the semiconductor device according to an embodiment of the present invention, and FIG. 29 is a cross-sectional view illustrating an exemplary mounting structure of the semiconductor device shown in FIG. 28.

First, the MAP substrate 14 shown in FIGS. 20 and 21 is provided. Although the MAP substrate 14 is a multi-chip substrate comprising the device regions 14a shown in FIG. 16 formed in a matrix arrangement, only two device regions 14a are illustrated in the present embodiment for convenience, using a drawing in which other device regions 14a are omitted.

In addition, although the cross-section structure of the substrate is omitted in the cross-sectional views of the MAP substrate 14 (FIGS. 21, 23, and 25 to 27) used for assembling the semiconductor device of the present embodiment, its detail structure is as shown in FIG. 16.

In the MAP substrate 14 shown in FIGS. 20 and 21, the power supply line 7z (shared part) of the dicing region 14b shown in FIG. 7 and the power supply line 7ze (shared part) of the central part (chip-mounting region 7k) are removed, and the solder resist film 7t2 is formed around the chip-mounting region 7k of the upper surface 7a circularly and convexly.

Furthermore, the plating layer 11 shown in FIG. 18 (e.g., gold plate) is formed on the surface of the pre-stack land 7c and the flip-chip land 7e, respectively.

Although FIG. 20 illustrates a structure that the power supply line 7ze is intermittently removed as shown in FIG. 7, the removed portions in each side may be coupled to each other.

Subsequently, die-bonding is performed as shown in FIGS. 22 and 23.

First, the controller chip 3 comprising the main surface 3a having a quadrangular planar shape shown in FIG. 19, the pads 3d formed on the main surface 3a, and the rear surface 3b opposite to the main surface 3a are provided in the chip-mounting region 7k, shown in FIG. 7, of the MAP substrate (wiring substrate) 14.

In this occasion, the controller chip 3 having the bump electrode 4 (e.g., solder bump) which is a conductive member preliminarily formed on each of the pads 3d is picked up and transferred by absorption using a transfer jig, and subsequently mounted on the chip-mounting region 7k of the device region 14a, shown in FIG. 16, of the MAP substrate 14 via the bump electrode 4.

In other words, the controller chip 3 is mounted so that its main surface 3a faces the front surface 7a of the MAP substrate 14 (the controller chip 3 is mounted so that its rear surface 3b faces upward). In this occasion, the controller chip 3 is mounted via the bump electrodes 4, with each of the flip-chip lands 7e and the bump electrodes 4 corresponding thereto being positioned in alignment. In this occasion, the MAP substrate 14 is placed on a stage (not shown) having a heating mechanism, the controller chip 3 is mounted on each of the device regions 14a of the MAP substrate 14, with the MAP substrate 14 being heated. Accordingly, the bump electrode 4 contacting the flip-chip land 7e formed on the device region 14a melts to join the bump electrode 14 and the flip-chip land 7e. In the present embodiment, heat of about 220 degrees Celsius or higher is applied.

Subsequently, filling of the underfill material (resin) 6 is performed. Here, the underfill material (die-bonding material and adhesive agent) 6 which is a flowable (paste-like) sealing material is supplied between the controller chip 3 and the MAP substrate 14. Specifically, the underfill material 6 is supplied, while maintaining the heating performed when the controller chip 3 is mounted on the MAP substrate 14. Here, there exists a risk that a fracture may occur at the joint between the bump electrode 4 and the flip-chip land 7e if the temperature of the heated MAP substrate 14 drops before the joint is sealed with the sealing material (underfill material 6). In the present embodiment therefore, the MAP substrate 14 is also heated in the step of supplying the sealing material so that the temperature of the MAP substrate 14 does not drop as much as possible. The method of supplying the sealing material, although not illustrated, drops the underfill material 6 from a nozzle along the two sides of the controller chip 3 near the controller chip 3 to be filled therein. Therefore, the amount of extrusion of the underfill material 6 along these two sides is larger than the amount of extrusion of the underfill material 6 along the other two sides, as shown in FIG. 24.

However, dropping of the underfill material 6 is not limited to the two sides of the controller chip, and may be performed along either one of the sides.

With regard to the controller chip 3, a part of the side 3c is covered with the underfill material 6, as shown in FIG. 25.

In assembling of the POP 1 of the present embodiment, the solder resist film 7t2 is circularly formed in a convex-shaped manner around the chip-mounting region 7k, shown in FIG. 16, of the front surface 7a of the MAP substrate 14, as shown in FIGS. 24 and 25, whereby the solder resist film 7t2 can act as a dam when the underfill material 6 is supplied to prevent outflow of the underfill material 6 to the pre-stack land 7c.

However, the underfill material 6 may cover the solder resist film 7t2, as long as it does not flow out to the pre-stack land 7c.

In addition, filling the underfill material 6 between the controller chip 3 and the MAP substrate 14 also fills the opening 7ae formed on the central part (chip-mounting region 7k) of the solder resist film 7t1 with the underfill material 6. Therefore, occurrence of cracks on the wiring substrate 7 starting from the opening 7ae can be suppressed.

The ball joining shown in FIG. 26 is performed after sealing of the joint has been completed. Here, the solder balls 5 which are external terminals are respectively formed on the third group of lands 7ad which is the third electrode terminal group, shown in FIG. 16, of the rear surface 7b of the MAP substrate 14. Specifically, a ball-shaped conductive member is provided on each of the lands 7j of the third group of lands 7ad, and the conductive member is melt by heating the conductive member and the MAP substrate 14, whereby the solder balls 5 are formed on the land 7j formed on the device region 14a.

Heat around 240 to 245 degrees Celsius, for example, is also applied in the ball joining step (referred to as solder reflow hereafter). Cracks in the wiring substrate 7 described above are particularly easy to occur when the wiring substrate 7 is heated. Specifically, heating the wiring substrate 7 causes the wiring substrate 7 to expand. Subsequently, the wiring substrate 7 shrinks as the temperature of the wiring substrate 7 drops. If, in this occasion, a member having a thermal expansion coefficient different from that of the wiring substrate 7 is fixed (mounted) on the wiring substrate 7, a stress concentrates on the wiring substrate 7 due to the difference with the expansion coefficient of this member. If the openings 7ac and 7ae are formed on the wiring substrate 7, cracks occur starting from the openings 7ac and 7ae. In the present embodiment, however, a starting point of cracks is unlikely to be formed on the openings 7ac and 7ae, because the openings 7ac and 7ae are filled with the sealing material (here, the underfill material 6) or the solder resist film 7t2.

As a result, occurrence of cracks can also be suppressed when solder reflow in the ball joining step is performed, whereby the reliability of the semiconductor device (POP 1) can be enhanced.

The dicing shown in FIG. 27 is performed after the ball joining has been completed. In other words, the dicing blade 16 is run across the dicing region 14b shown in FIG. 26 to cut the MAP substrate 14, whereby a plurality of packages are acquired.

In other words, assembling of the lower package 2 is completed by the cutting step of the MAP substrate 14 using the blade 16.

Subsequently, as shown in FIG. 28, the lower package 2 and the upper package 9 are joined (pre-stacked) and assembling of the POP 1 is completed. Here, the preassembled upper package 9 is stacked on the lower package 2.

In this occasion, the pre-stack land 7c of the lower substrate 7 of the lower package 2 and the land 13d of the upper substrate 13 of the upper package 9 are coupled as conductive members by the solder ball 8, for example. Again, the solder ball 8 is melted by solder reflow, and the pre-stack land 7c and the land 13d are coupled via the solder ball 8.

In the pre-stacking step of stacking the upper package 9 on the lower package 2 via the solder ball 8, heat of around 240 to 245 degrees Celsius, for example, is also applied. In this occasion, the problem of cracks occurring from the openings 7ac and 7ae as the starting point is particularly likely to arise if the openings 7ac and 7ae of the solder resist film 7t1 are open when a thermal stress is exerted on the openings 7ac and 7ae.

In the present embodiment, however, a starting point of cracks is unlikely to be formed on the openings 7ac and 7ae, because the openings 7ac and 7ae are filled with the sealing material (here, the underfill material 6) or the solder resist film 7t2.

As a result, occurrence of cracks can also be suppressed when solder reflow in the pre-stacking process is performed, whereby the reliability of the semiconductor device (POP 1) can be enhanced.

Next, the mounting structure of the POP 1 of the present embodiment will be described.

As shown in FIG. 29, the assembled POP 1 is mounted on the mother substrate (mounting substrate) 18 via the solder balls 5 which are its external terminal. In this occasion, the solder balls 5 are melted by solder reflow, and the lands 7j and the leads 18a are coupled via the solder balls 5, and the POP 1 is mounted on the mother substrate 18.

In the mounting step of the POP 1, heat of around 240 to 245 degrees Celsius, for example, is also applied. In this occasion, the problem of cracks occurring from the openings 7ac and 7ae as the starting point is particularly likely to arise if the openings 7ac and 7ae of the solder resist film 7t1 are open when a thermal stress is applied on the openings 7ac and 7ae. In the present embodiment, however, a starting point of cracks is unlikely to be formed on the openings 7ac and 7ae, because the openings 7ac and 7ae are filled with the sealing material (here, the underfill material 6) or the solder resist film 7t2.

As a result, occurrence of cracks can also be suppressed when solder reflow in the mounting step of the POP 1 is performed, whereby the reliability of the semiconductor device (POP 1) can be enhanced.

Next, an exemplary variation of the present embodiment will be described.

Figure 30:
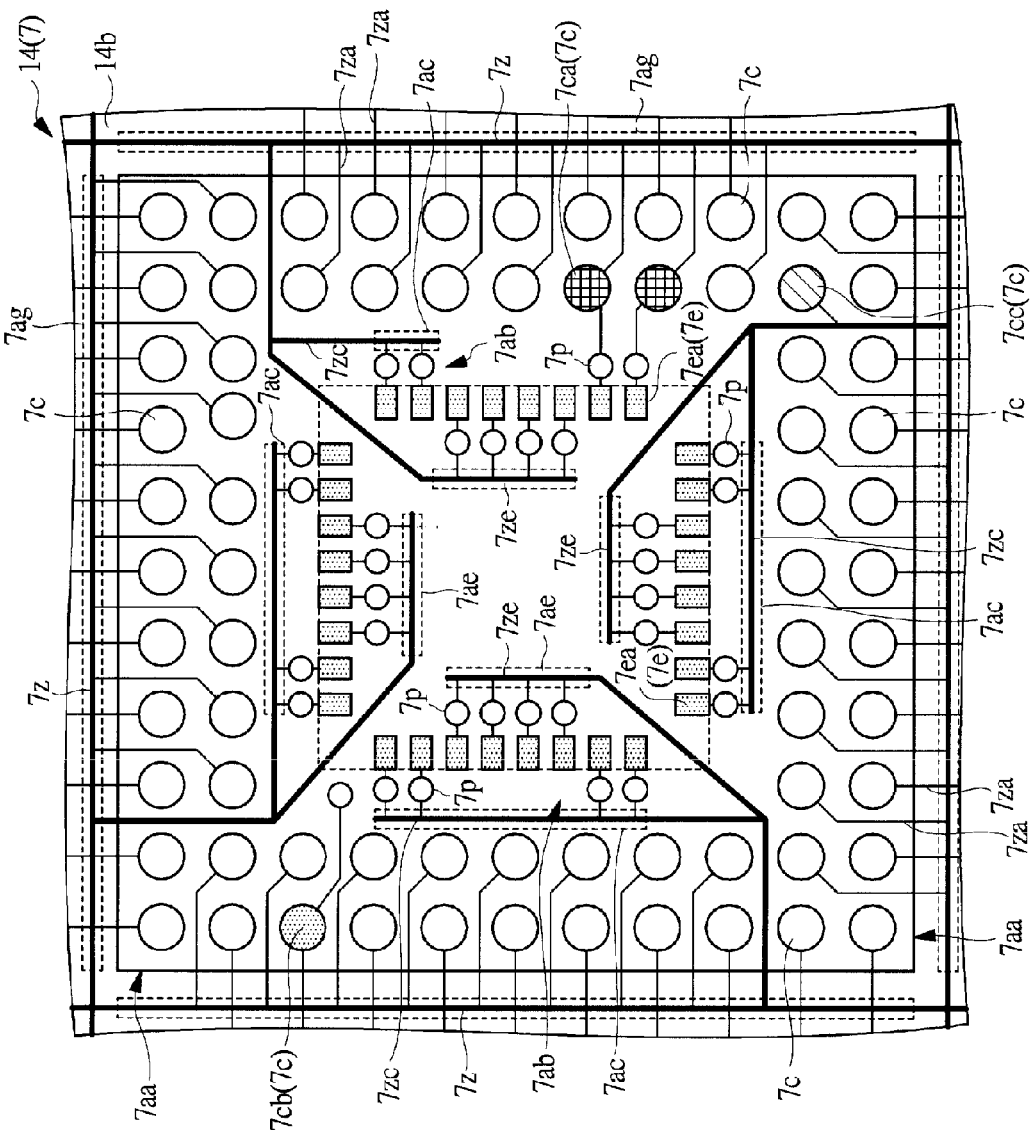
FIG. 30 is an enlarged partial plan view illustrating the structure of a first variation of the wiring substrate according to an embodiment of the present invention.

Although a case has been described in the above-mentioned embodiment that the flip-chip lands 7e are formed on a plurality of columns, the present invention may be applied, to the wiring substrate 7 having the flip-chip lands 7e formed on a single column, as shown in the exemplary variation of FIG. 30, for example. The reason will be described below. First, if the flip-chip lands 7e are formed (arranged) on a single column as on FIG. 30, it is conceivable that the shared part of the power supply line coupled to these flip-chip lands 7e is provided closer, in the plan view, to the central part on the front surface of the wiring substrate 7 than the flip-chip lands 7e. Providing the shared part of the power supply line on the central part on the front surface of the wiring substrate 7 can fill the opening formed on the solder resist film 7t1 with the die-bonding material (adhesive agent) or the sealing material (underfill material) used in the subsequent step of mounting the semiconductor chip in order to remove the shared part of the power supply line.

However, along with downsizing of semiconductor devices, the external size of the wiring substrate 7 and the semiconductor chips tends to be smaller. Accordingly, it becomes difficult to arrange all the vias 7p coupled to the flip-chip land 7e at the central part on the front surface of the wiring substrate 7. Therefore, it is necessary to draw the power supply lines 7z separately for the inner region and the outer region (first region 7ab) of the flip-chip land line and, as a result, the opening 7ac is also formed on the outer region (first region 7ab) which is not included on the chip-mounting region 7k.

From the above reasons, even if the flip-chip lands 7e are formed on a single column, it is necessary to fill the opening formed on the outer region with the solder resist film 7t2, as in the above-mentioned embodiment, in order to enhance the reliability of the semiconductor device, when the power supply lines 7z are drawn separately for the inner region and the outer region (first region 7ab) of the flip-chip land column.

Figure 31:
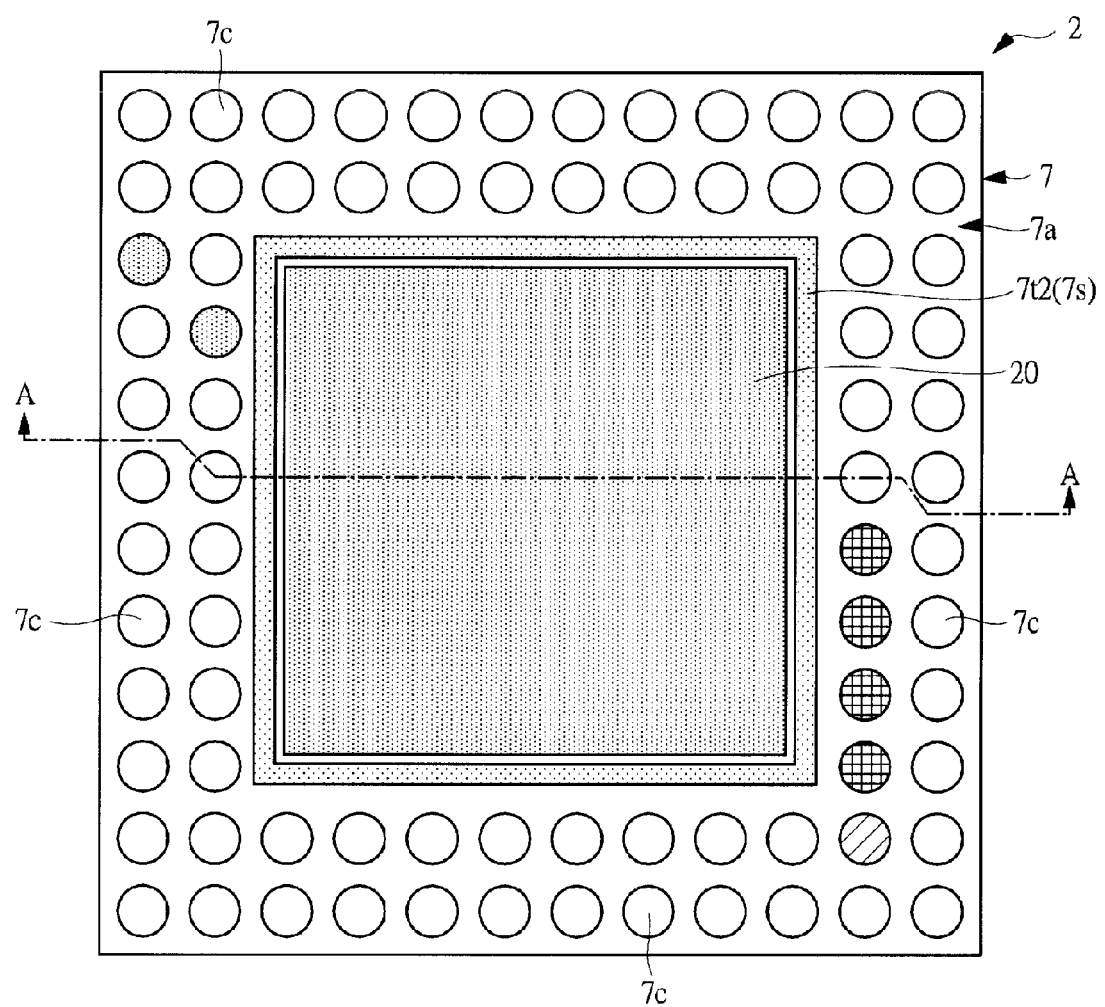
FIG. 31 is a plan view illustrating the structure of a second variation of the lower package in the semiconductor device according to an embodiment of the present invention.
Figure 32:
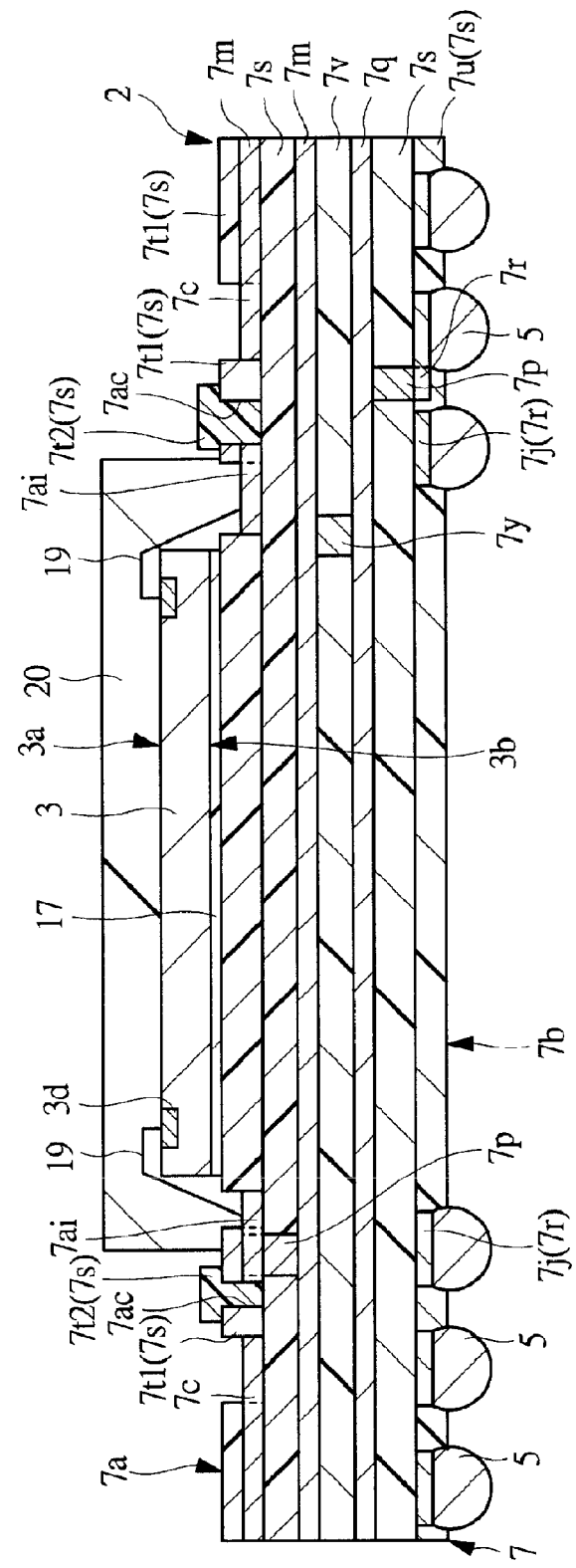
FIG. 32 is a cross-sectional view illustrating a structure taken along the line A-A of FIG. 31.

Next, FIG. 31 is a plan view illustrating the structure of a second variation of the lower package in the semiconductor device according to an embodiment of the present invention. FIG. 32 is a cross-sectional view illustrating a structure taken along the line A-A of FIG. 31, and FIG. 33 is the plan view illustrating the structure with the sealing body of the lower package of FIG. 31 removed.

Figure 33:
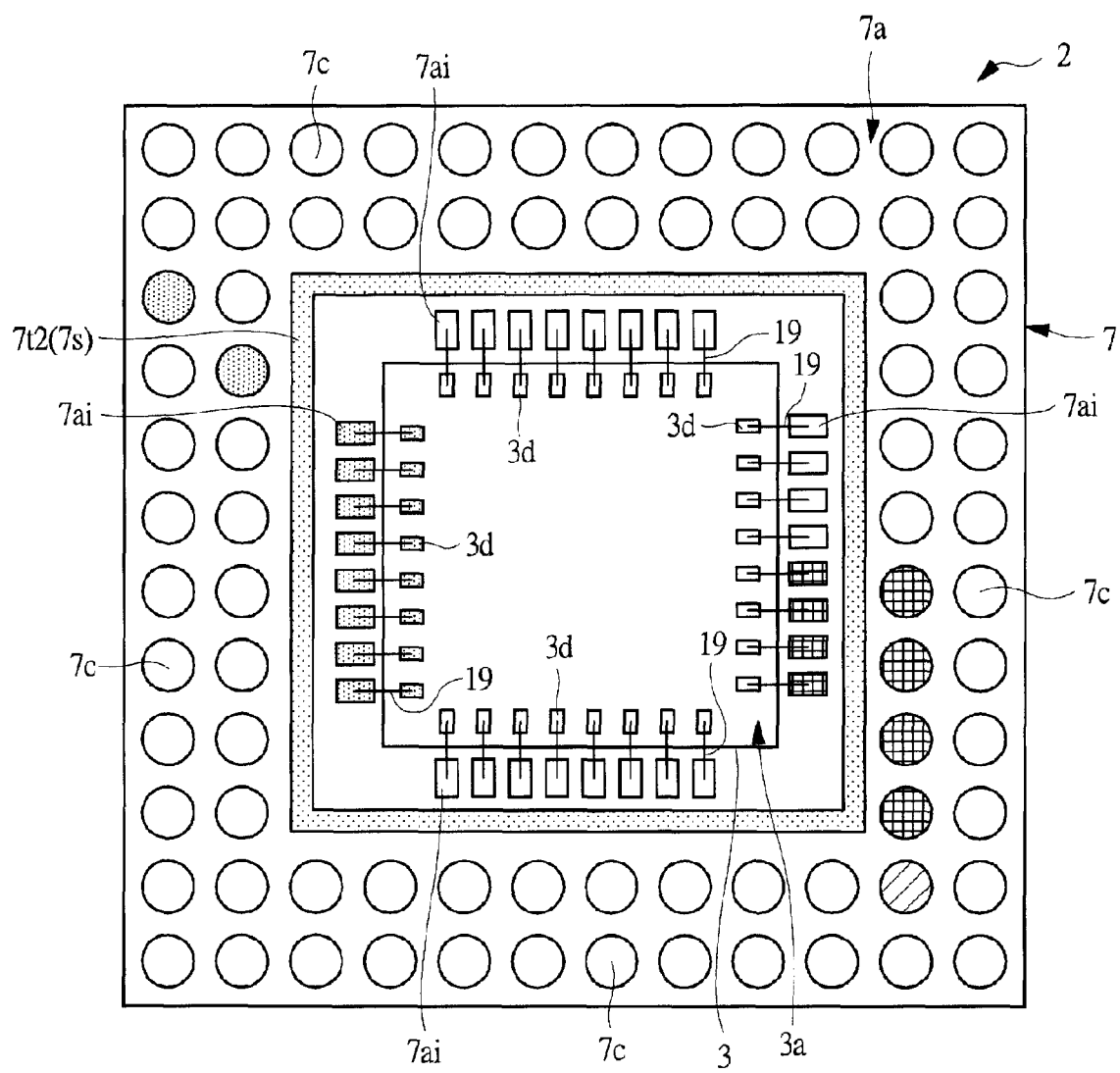
FIG. 33 is a plan view illustrating the structure with the sealing body of the lower package of FIG. 31 removed.

FIGS. 31 to 33 illustrate a structure in which the lower package 2 in the POP 1 employs wire bonding. In other words, the pad 3d of the controller chip 3 and the bonding lead Tai of the lower substrate 7 are coupled by wires 19 made of a conductive member, and further, the wires 19 and the controller chips 3 mounted on the lower substrate 7 are resin-sealed by a sealing body 20 made of resin material. The controller chip 3 is face-up mounted on the lower substrate 7 with the main surface 3a facing upward for wire coupling, and joined with the lower substrate 7 via the die-bonding material 17. The surface of bonding lead 7ai of the second exemplary variation has a plating film such as gold (Au) formed thereon via the power supply line.

Therefore, when the controller chip 3 over the lower substrate 7 is mounted, it is mounted on the chip-mounting region of the lower substrate 7 via the flowable (paste-like) die-bonding material 17 (adhesive agent) so that the rear surface 3b of the controller chip 3 faces the front surface 7a of the lower substrate 7.

As shown in FIGS. 31 and 32, the lower package 2 of the second variation also has the solder resist film 7t2 circularly formed on its front surface 7a. The solder resist film 7t2 is formed over the solder resist film 7t1 as shown in FIG. 32 such that the opening 7ac formed on the solder resist film 7t1, and circularly formed around the bonding lead 7ai are filled as shown in FIG. 33. The reason why it is also preferred in the second exemplary variation to form the solder resist film 7t2 circularly and monolithically as with the above-mentioned embodiment is that, in the second exemplary variation, the die-bonding material 17 used for mounting the semiconductor chips on the wiring substrate is flowable similarly to the sealing material used in the above-mentioned embodiment and therefore, it is preferred to form the solder resist film 7t2 circularly and monolithically as with the above-mentioned embodiment in order to prevent the die-bonding material 17 from flowing out to the pre-stack land 7c.

In addition, the second exemplary variation comprises the sealing body 20 as described above. The sealing body 20 is formed on the inner region of the circular solder resist film 7t2. Considering the bending of the lower package 2, it is preferred that the sealing body 20 is made of a similar material (epoxy type resin) with the thermal expansion coefficient ($\alpha$) of the material being close to that of the solder resist film 7t1 and the solder resist film 7t2. It is also preferred to reduce the amount of resin as much as possible because an increased amount of resin used in the sealing body 20 causes bending of the package.

In order to reduce the amount of resin of the sealing body 20 in the lower package 2 of the second variation, the peripheral edge of the sealing body 20 is located immediately outside the bonding lead 7ai as shown in FIG. 32 so that this region (region inside the circular solder resist film 7t2) acts as the sealing region. In other words, the sealing body 20 is formed such that the opening 7ac that has been formed to remove the power supply line coupled to the bonding lead 7ai are exposed.

Since a starting point of cracks may also be formed on the lower package 2 in which the semiconductor chips are wire-coupled if the opening 7ac of solder resist film 7t1 is not filled with resin, it is preferred to fill the opening 7ac with the solder resist film 7t2 as with the lower package 2 of the second exemplary variation shown in FIGS. 31 to 33. The formation of a starting point of cracks can thus be suppressed and, as a result, it can be employed as the lower package of the POP 1.

Therefore, the POP 1 having the lower package 2 of the second variation shown in FIGS. 31 to 33 built therein can bring about an effect similar to that of the POP 1 shown in FIG. 1.

Although the invention made by the inventors has thus been specifically described based on embodiments, it is needless to say that the present invention is not limited to the above-mentioned embodiments and can be modified in various ways within a range that does not deviate from the scope of the invention.

For example, although a case has been described in the above-mentioned embodiments where a power supply line (shared part) is formed on the wiring layer 7n provided on the front surface 7a of the wiring substrate 7 (lower substrate) of the POP-type semiconductor device, the power supply line (shared part) may be formed on the wiring layer 7r provided on the rear surface (mounting face) 7b of the wiring substrate 7. In this occasion, it is preferred to form, monolithically and not separately, the insulating film (solder resist film) which fills the opening in order to enhance the strength (rigidity) of the wiring substrate, as described in the above-mentioned embodiments. However, since it is difficult to provide a power supply line (shared part) between adjacent lands in the case of a so-called full array structure in which the lands 7j formed on the rear surface 7b of the wiring substrate 7 are provided in a matrix without a gap in the plan view, it is preferred that the power supply line (shared part) is formed on the front surface of the wiring substrate 7 as described above desirable for such a full array structure.

Additionally, although a process has been described in the above-mentioned embodiments which supplies the sealing material between the semiconductor chip and the front surface of the wiring substrate after providing semiconductor chip in the chip-mounting region 7k in the step of mounting the semiconductor chip in each of the device regions of the MAP substrate, the invention is not limited to the above-mentioned embodiment, and a method may be employed such as preliminarily applying the sealing material (underfill material 6) to the chip-mounting region 7k, providing the semiconductor chip in the chip-mounting region 7k with the wiring substrate being heated so that the main surface of semiconductor chip faces the front surface of the wiring substrate, coupling the bump electrode 4 and the flip-chip land 7e while pushing and spreading the sealing material around the part on which the sealing material has been coated by adding load to the rear surface of semiconductor chip, and sealing the joint between the bump electrode 4 and the flip-chip land 7e with the pushed and spread sealing material.

Additionally, although a case has been described in the exemplary variation where an opening formed on the inner region of the flip-chip land column, among the openings formed on the solder resist film 7t1 covering the uppermost (first) wiring layer 7n of the solder resist film 7t2, is filled with the die-bonding material (adhesive agent) or then sealing material (underfill material) used in the subsequent step of mounting the semiconductor chip, an opening formed on the inner region of the flip-chip land column may be filled with the sealing body 20 which seals the semiconductor chip if the external size of the semiconductor chip to be mounted on the wiring substrate is smaller than the area (size) of the region surrounded by the opening formed on the inner region of the flip-chip land column.

The present invention is available for an electronic device formed by stacking another substrate on a substrate having semiconductor chips mounted thereon.

What is claimed is:

1. A method of manufacturing a semiconductor device, comprising the steps of:
    (a) providing a wiring substrate which includes an front surface comprised of a quadrangle in a plan view, a chip-mounting region provided on the front surface, a first electrode terminal group formed on the front surface and formed along an end portion of the front surface, a second electrode terminal group formed on the front surface and formed inside of the front surface than the first electrode terminal group in the plan view, a plurality of first power supply lines coupled to a plurality of first electrodes in the first electrode terminal group, respectively, and extending from the first electrodes toward the end portion of the front surface, respectively, a plurality of second power supply lines coupled to a plurality of second electrodes in the second electrode terminal group, respectively, and extending from the second electrodes toward a first region located between the first electrode terminal group and the second electrode terminal group in the plan view, a first front surface-side insulating film having an opening portion opening the first region and formed on the front surface such that the first and second electrode terminal groups are exposed, and such that the first and second power supply lines are covered, a second front surface-side insulating film formed over the first front surface-side insulating film such that the opening portion is filled, and such that the first and second electrode terminal groups are exposed, a rear surface opposite to the front surface, a third electrode terminal group formed on the rear surface and coupled to the first and second electrode terminal groups, respectively, and a first rear surface-side insulating film formed on the rear surface such that the third electrode terminal groups are exposed;
    (b) mounting a semiconductor chip on the chip-mounting region of the wiring substrate, the semiconductor chip including a front surface comprised of a quadrangle in the plan view, a plurality of bonding pads formed on the front surface, and a rear surface opposite to the front surface;
    (c) coupling the bonding pads of the semiconductor chip and the second electrodes of the wiring substrate via a plurality of conductive members, respectively; and
    (d) forming a plurality of external terminals on the third electrode terminal group of the wiring substrate, respectively,
    wherein a plating layer is formed on a surface of each of the first and second electrode terminal groups by electrolytic plating method;
    wherein the first region is provided along aside of the semiconductor chip in the plan view;
    wherein the first region is disposed around the semiconductor chip in the plan view; and
    wherein the second front surface-side insulating film is circularly formed around the semiconductor chip in the plan view.

2. The method of manufacturing a semiconductor device according to claim 1,
    wherein a method of manufacturing the wiring substrate includes the steps of:
    (a1) providing the wiring substrate which includes the front surface, the chip-mounting region, the first electrode terminal group, the second electrode terminal group, the first power supply lines, the second power supply lines, third power supply lines formed on the front surface and coupled to each of the second power supply lines, the first front surface-side insulating film formed on the front surface which has the opening, such that the first electrode terminal group, the second electrode terminal group and the third power supply lines are exposed, and to cover the first power supply lines and the second power supply lines, and which further includes the rear surface, the third electrode terminal group, and the first rear surface-side insulating film are covered;
    (a2) after the step (a1), forming the plating layer, by electrolytic plating, on the surfaces of the first electrode terminal group and the second electrode terminal group exposed from the first front surface-side insulating film;
    (a3) after the step (a2), removing the third power supply lines exposed from the opening; and
    (a4) after the step (a3), forming the second front surface-side insulating film over the first front surface-side insulating film such that the inside of the opening are filled, and the first electrode terminal group and the second electrode terminal group are exposed.

3. The method of manufacturing a semiconductor device according to claim 1,
    wherein the wiring substrate includes a base material having a front surface and a rear surface, a first front surface-side wiring layer formed on the surface of the base material, a third front surface-side insulating film formed over the first front surface-side wiring layer, a second front surface-side wiring layer formed over the first front surface-side insulating film and coupled to the first front surface-side wiring layer, the first front surface-side insulating film formed over the second front surface-side wiring layer, a first rear surface-side wiring layer formed on the rear surface of the base material and coupled to the first front surface-side wiring layer, a second rear surface-side insulating film formed over the first rear surface-side wiring layer, a second rear surface-side wiring layer formed over the first rear surface-side insulating film and coupled to the first rear surface-tide wiring layer, and the first rear surface-side insulating film formed over the second rear surface-side wiring layer, and
    wherein the base material is made of a first resin material containing glass fiber, whereas the first front surface-side insulating film and the first rear surface-side insulating film are made of a second resin material which does not contain the glass fiber.

4. The method of manufacturing a semiconductor device according to claim 1,
    wherein the second front surface-side insulating film is formed such that its thickness is larger than that of the first front surface-side insulating film.

5. The method of manufacturing a semiconductor device according to claim 3,
    wherein the second electrode terminal group includes the second electrodes coupled to any of the first electrodes of the first electrode terminal group via wirings of the second front surface-side wiring layer, without being coupled to the second power supply lines.

6. The method of manufacturing a semiconductor device according to claim 1, wherein the second electrodes of the second electrode terminal group are arranged in two columns, namely an inner column and an outer column, and the second electrodes on the inner column are coupled to a fourth power supply line extending further inward than the inner column.

7. The method of manufacturing a semiconductor device according to claim 6, wherein the second electrodes of the second electrode terminal group are arranged in a staggered array along the circumference of the semiconductor chip.

8. The method of manufacturing a semiconductor device according to claim 1, wherein the second front surface-side insulating film has a position overlapping the first front surface-side insulating film around the opening of the first region.

* * * * *